(12) United States Patent
Nakata et al.

(10) Patent No.: US 12,501,831 B2
(45) Date of Patent: Dec. 16, 2025

(54) ACTUATOR, DRIVE APPARATUS, AND ELECTRONIC APPARATUS

(71) Applicant: SONY GROUP CORPORATION, Tokyo (JP)

(72) Inventors: Akihiro Nakata, Tokyo (JP); Satoshi Nakamaru, Tokyo (JP); Yoshio Goto, Tokyo (JP); Michiko Nakao, Tokyo (JP); Kazuhiko Miyahara, Tokyo (JP)

(73) Assignee: SONY GROUP CORPORATION, Tokyo (JP)

( * ) Notice: Subject to any disclaimer, the term of this patent is extended or adjusted under 35 U.S.C. 154(b) by 964 days.

(21) Appl. No.: 17/636,261

(22) PCT Filed: Aug. 20, 2020

(86) PCT No.: PCT/JP2020/031401
§ 371 (c)(1),
(2) Date: Feb. 17, 2022

(87) PCT Pub. No.: WO2021/039567
PCT Pub. Date: Mar. 4, 2021

(65) Prior Publication Data
US 2022/0293847 A1 Sep. 15, 2022

(30) Foreign Application Priority Data
Aug. 30, 2019 (JP) .................. 2019-158597

(51) Int. Cl.
*H01L 41/02* (2006.01)
*H10N 30/20* (2023.01)
(Continued)

(52) U.S. Cl.
CPC .......... *H10N 30/508* (2023.02); *H10N 30/20* (2023.02); *H10N 30/87* (2023.02)

(58) Field of Classification Search
CPC ....... H10N 30/508; H10N 30/20; H10N 30/87
(Continued)

(56) References Cited

U.S. PATENT DOCUMENTS

| 5,977,685 A | 11/1999 | Kurita et al. |
| 9,232,571 B2 | 1/2016 | Ahn |

(Continued)

FOREIGN PATENT DOCUMENTS

| EP | 1962352 A1 | 8/2008 |
| EP | 2619639 A2 | 7/2013 |

(Continued)

OTHER PUBLICATIONS

International Search Report and Written Opinion of PCT Application No. PCT/JP2020/031401, issued on Oct. 6, 2020, 11 pages of ISRWO.

*Primary Examiner* — Derek J Rosenau
(74) *Attorney, Agent, or Firm* — CHIP LAW GROUP

(57) ABSTRACT

An actuator includes an actuator body that includes a first surface and a second surface that face each other, a first constraining member that is provided on the first surface, and constrains the first surface from expanding and contracting, and a second constraining member that is provided on the second surface, and constrains the second surface from expanding and contracting. The actuator body includes a first electrode, a second electrode that faces the first electrode, and an elastomer layer that is provided between the first electrode and the second electrode. The first electrode is a pattern electrode. The first constraining member and the second constraining member are provided correspondingly to the first electrode.

16 Claims, 29 Drawing Sheets

(51) Int. Cl.
*H10N 30/50* (2023.01)
*H10N 30/87* (2023.01)

(58) Field of Classification Search
USPC .................................................. 310/328, 800
See application file for complete search history.

(56) References Cited

U.S. PATENT DOCUMENTS

| | | | |
|---|---|---|---|
| 2007/0200467 A1* | 8/2007 | Heydt | H04R 19/02 310/800 |
| 2007/0200468 A1* | 8/2007 | Heim | F04B 43/0054 310/800 |
| 2008/0196815 A1 | 8/2008 | Yamada et al. | |
| 2012/0068957 A1 | 3/2012 | Puskarich et al. | |

FOREIGN PATENT DOCUMENTS

| | | | |
|---|---|---|---|
| JP | 4-359684 A | 12/1992 | |
| JP | 8-335726 A | 12/1996 | |
| JP | 2008-206285 A | 9/2008 | |
| JP | 2009-021328 A | 1/2009 | |
| JP | 2009303325 A | 12/2009 | |
| JP | 2014-207391 A | 10/2014 | |
| JP | 2019-004629 A | 1/2019 | |
| JP | 2019-068031 A | 4/2019 | |
| TW | 201218039 A | 5/2012 | |
| WO | 2012/039876 A2 | 3/2012 | |
| WO | 2016/031137 A1 | 3/2016 | |
| WO | 2019/065417 A1 | 4/2019 | |

\* cited by examiner

ACTUATOR, DRIVE APPARATUS, AND ELECTRONIC APPARATUS

CROSS REFERENCE TO RELATED APPLICATIONS

This application is a U.S. National Phase of International Patent Application No. PCT/JP2020/031401 filed on Aug. 20, 2020, which claims priority benefit of Japanese Patent Application No. JP 2019-158597 filed in the Japan Patent Office on Aug. 30, 2019. Each of the above-referenced applications is hereby incorporated herein by reference in its entirety.

TECHNICAL FIELD

The present disclosure relates to an actuator, a drive apparatus, and an electronic apparatus.

BACKGROUND ART

In recent years, a polymer actuator that converts electrical energy into mechanical energy is widely known. One of the polymer actuators is a multilayer actuator in which an electrode and an elastomer layer are arranged in a layered formation (for example, refer to Patent Literature 1).

CITATION LIST

Patent Literature

Patent Literature 1: WO2016/031137

DISCLOSURE OF INVENTION

Technical Problem

However, when the multilayer actuator described above is applied to, for example, a drive apparatus or an electronic apparatus, there may be a decrease in strain caused when voltage is applied.

It is an object of the present disclosure to provide an actuator that makes it possible to reduce a decrease in strain caused when voltage is applied, a drive apparatus that includes the actuator, and an electronic apparatus that includes the actuator.

Solution to Problem

In order to achieve the object described above, a first disclosure is an actuator that includes
an actuator body that includes a first surface and a second surface that face each other;
a first constraining member that is provided on the first surface, and constrains the first surface from expanding and contracting; and
a second constraining member that is provided on the second surface, and constrains the second surface from expanding and contracting,
the actuator body including
a first electrode,
a second electrode that faces the first electrode, and
an elastomer layer that is provided between the first electrode and the second electrode,
the first electrode being a pattern electrode,
the first constraining member and the second constraining member being provided correspondingly to the first electrode.

A second disclosure is a drive apparatus that includes
an actuator that includes a first surface and a second surface that face each other;
a driven body that is provided on the first surface; and
a base material that is provided on the second surface, the actuator including
a first electrode,
a second electrode that faces the first electrode, and
an elastomer layer that is provided between the first electrode and the second electrode,
the driven body including a first constraining member that constrains the first surface,
the base material including a second constraining member that constrains the second surface,
the first electrode being a pattern electrode,
the first constraining member and the second constraining member being provided correspondingly to the first electrode.

A third disclosure is an actuator that includes
an actuator body that includes a first surface and a second surface that face each other;
a first constraining member that is provided on the first surface, and constrains the first surface from expanding and contracting; and
a second constraining member that is provided on the second surface, and constrains the second surface from expanding and contracting,
the actuator body including
a first electrode,
a second electrode that faces the first electrode, and
an elastomer layer that is provided between the first electrode and the second electrode,
the first electrode including at least one of a gap or a hole,
the first constraining member and the second constraining member being provided correspondingly to the first electrode.

A fourth disclosure is a drive apparatus that includes the actuator of the first disclosure or the third disclosure.

A fifth disclosure is an electronic apparatus that includes the actuator of the first disclosure or the third disclosure.

BRIEF DESCRIPTION OF DRAWINGS

FIGS. 20A, 20B, and 200 are cross-sectional views used to describe an example of a process of producing the actuator according to the modification of the first embodiment of the present disclosure.

MODE(S) FOR CARRYING OUT THE INVENTION

Figure 1A:
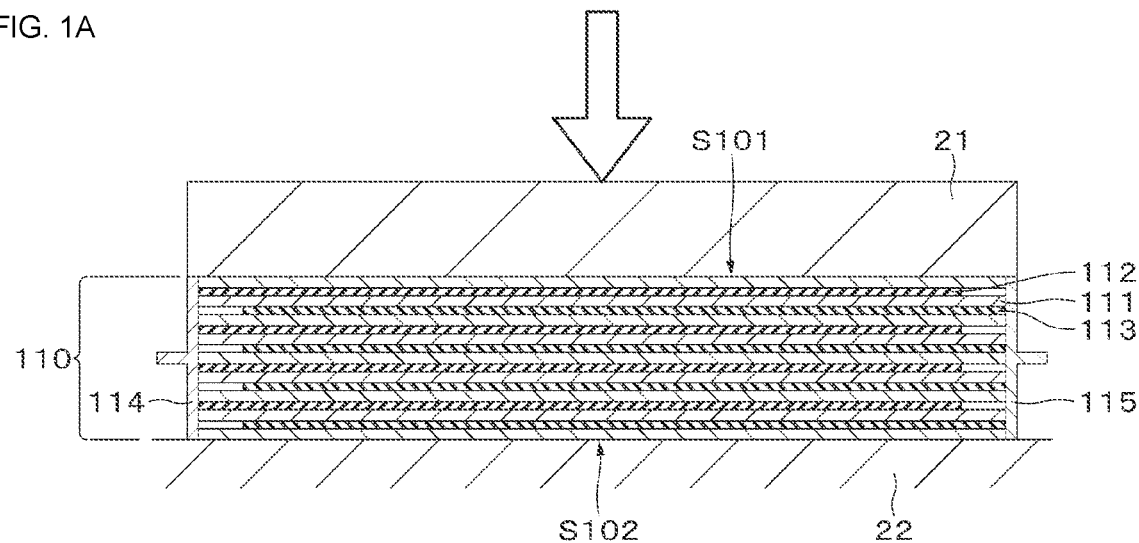
FIG. 1A is a cross-sectional view illustrating an example of a configuration of an actuator of which a first surface and a second surface that face each other are entirely constrained.

Embodiments and application examples of the present disclosure will be described in the following order. Note that, in all of the figures for the following embodiments and the following application examples, identical or corresponding portions are denoted by the same reference numeral.

1. First Embodiment (Example of Actuator)
2. Second Embodiment (Example of Actuator)
3. Application Example (Example of Image-Capturing Apparatus)
4. Application Example (Example of Display Apparatus)
5. Application Example (Example of Multipoint Tactile Display)

Figure 1B:
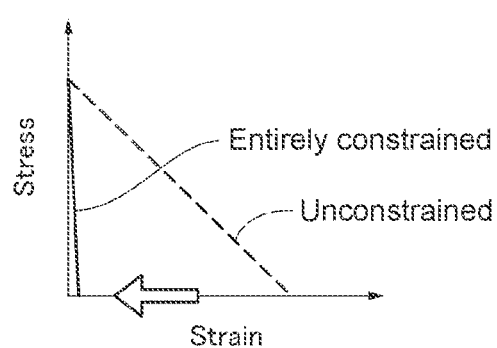
FIG. 1B is a graph illustrating stress-strain characteristics of the actuator illustrated in FIG. 1A.

<1. First Embodiment> [Outline] FIG. 1A is a cross-sectional view illustrating an example of a configuration of an actuator 110 including a first surface S101 and a second surface S102 that face each other are entirely constrained. FIG. 1B is a graph illustrating stress-strain characteristics of the actuator 110 illustrated in FIG. 1A (hereinafter referred to as "S-S characteristics") when the actuator 110 is driven. The actuator 110 includes a plurality of elastomer layers 111, a plurality of electrodes 112, and a plurality of electrodes 113. The electrode 112 and the electrode 113 are alternately arranged in a layered formation such that the elastomer layer 111 is situated between the electrode 112 and the electrode 113. An extraction electrode 114 that is connected to the plurality of electrodes 112, and an extraction electrode 115 that is connected to the plurality of electrodes 113 are provided on the periphery of the actuator 110.

When the actuator 110 having the configuration described above is applied to, for example, a drive apparatus or an electronic apparatus, the first surface S101 is entirely constrained by a driven body 21 since the first surface S101 is bonded to the driven body 21. On the other hand, a base material 22 is bonded to the second surface S102, and the second surface S102 is entirely constrained by the base material 22. When the first surface S101 and the second surface S102 are entirely constrained, as described above, there will be a significant decrease in strain, compared to when the first surface S101 and the second surface S102 are unconstrained, as illustrated in B of FIG. 1B. In other words, there is a significant decrease in an amount of displacement of the actuator 110. The actuator 110, which is a dielectric elastomer actuator, has a low rigidity and is not compressed. Thus, the actuator 110 is easily affected by the first surface S101 and the second surface S102 being constrained. In particular, when the actuator 110 is made thinner, an amount of displacement is significantly reduced by the first surface S101 and the second surface S102 being constrained.

Figure 2A:
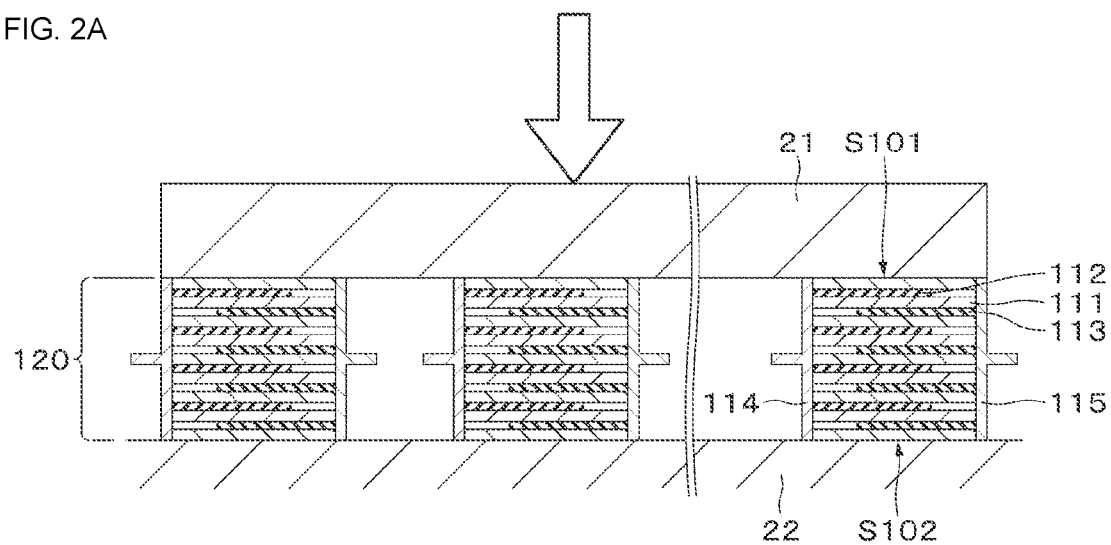
FIG. 2A is a cross-sectional view illustrating an example of a configuration of an arrayed actuator.
Figure 2B:
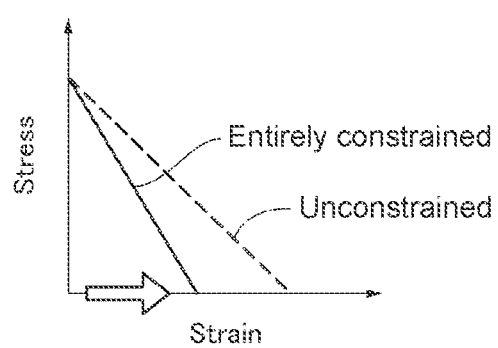
FIG. 2B is a graph illustrating stress-strain characteristics of the actuator illustrated in FIG. 2A.

FIG. 2A is a cross-sectional view illustrating an example of a configuration of an arrayed actuator 120. FIG. 2B is a graph illustrating S-S characteristics of the actuator 120 illustrated in FIG. 2A when the actuator 120 is driven. According to findings of the inventors, the arrayed actuator 120 makes it possible to reduce a decrease in strain, compared with the actuator 110 (refer to FIG. 1A) of which the first surface S101 and the second surface S102 are entirely constrained, as illustrated in FIG. 2A. In other words, it is possible to reduce a decrease in an amount of displacement of the actuator 120. However, with respect to the arrayed actuator 120, the configuration of the actuator 120 and the process of producing the actuator 120 are complicated.

Figure 3A:
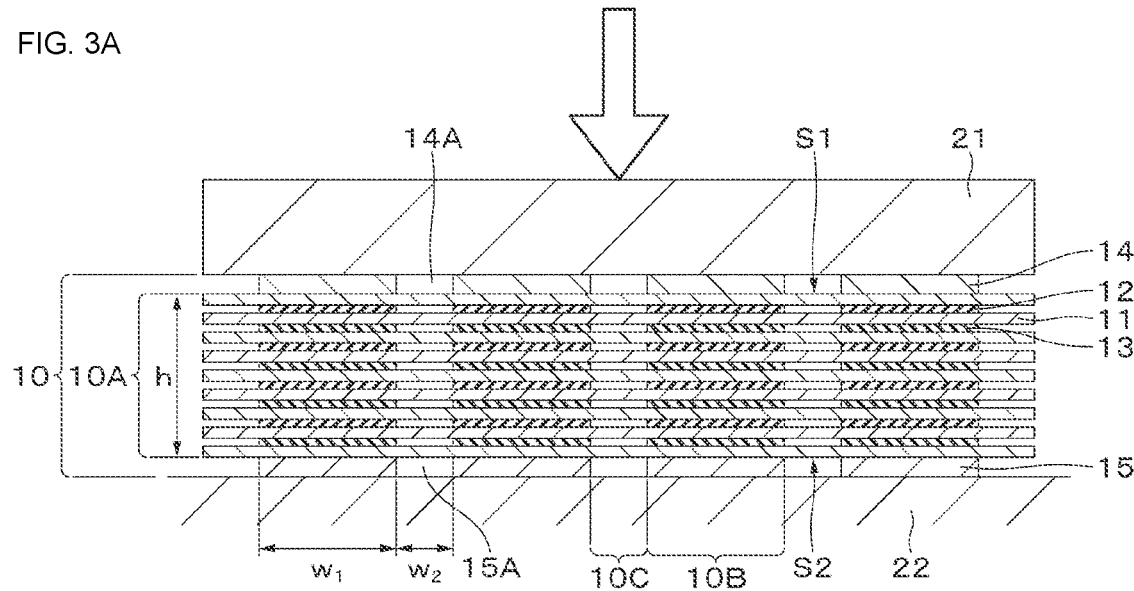
FIG. 3A is a cross-sectional view illustrating an example of a configuration of an actuator according to a first embodiment of the present disclosure.

Thus, the inventors have made every effort to discuss an actuator that makes it possible to reduce a decrease in strain caused when voltage is applied, while preventing the configuration of the actuator and the process of producing the actuator from being made complicated. Consequently, the inventors have found a configuration in which constraining members 14 and 15 that correspond to the electrode 12 are respectively provided to the first surface S1 and the second surface S2 of an actuator body 10A, as illustrated in FIG. 3A. The actuator 10 having such a configuration is described below.

Figure 3B:
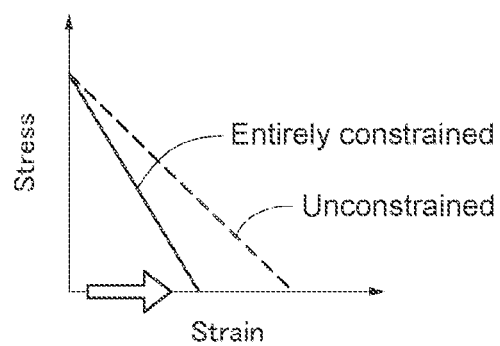
FIG. 3B is a graph illustrating the stress-strain characteristics of the actuator illustrated in FIG. 3A.
Figure 4:
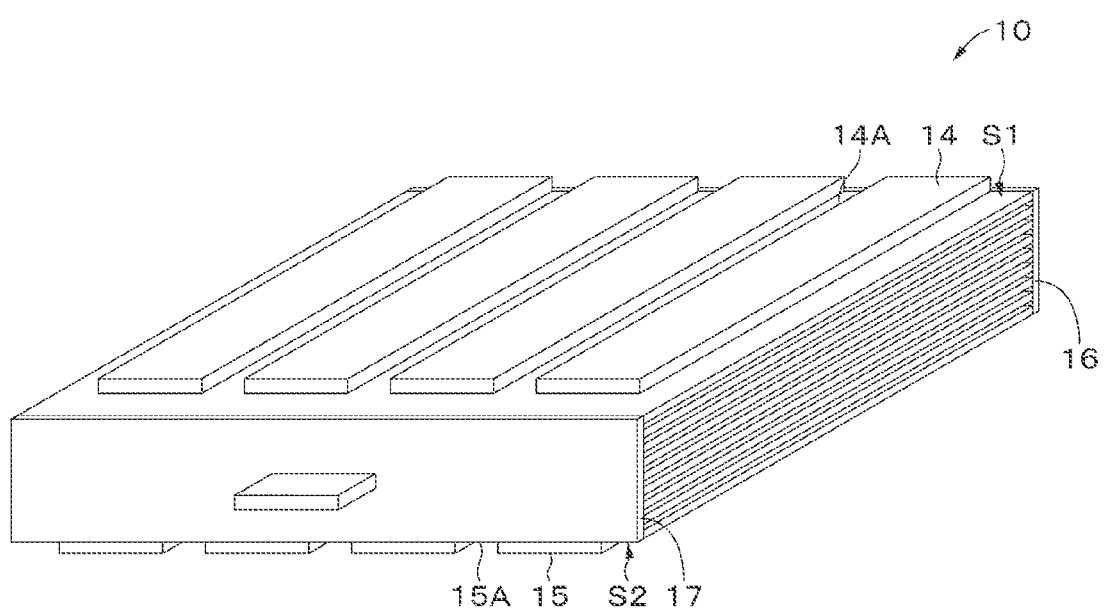
FIG. 4 is a perspective view illustrating an example of the configuration of the actuator according to the first embodiment of the present disclosure.
Figure 5:
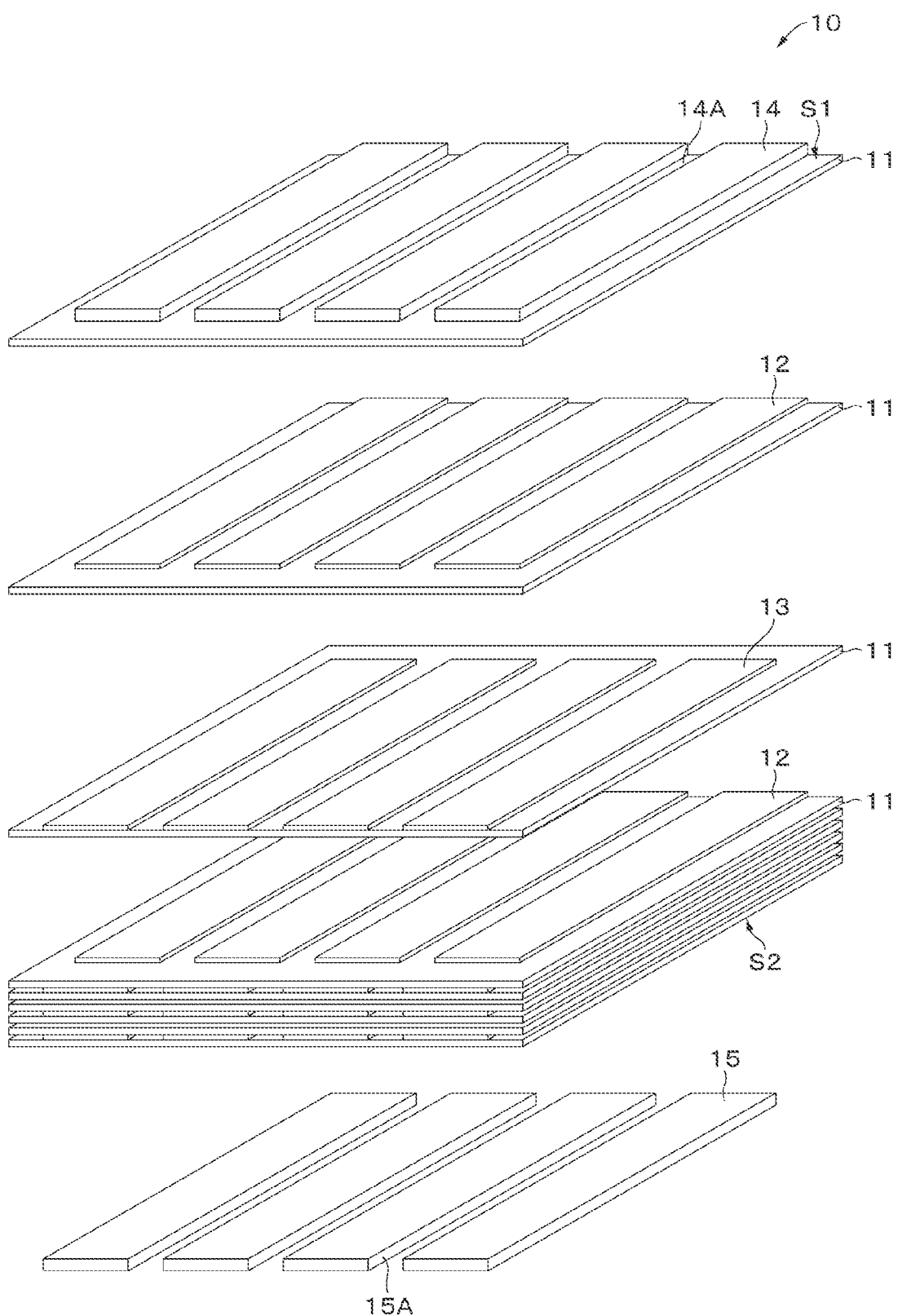
FIG. 5 is an exploded perspective view illustrating an example of the configuration of the actuator according to the first embodiment of the present disclosure.

[Configuration of Actuator] FIG. 3A is a cross-sectional view illustrating an example of a configuration of the actuator 10 according to a first embodiment of the present disclosure. FIG. 3B is a graph illustrating S-S characteristics of the actuator 10 when the actuator 10 is driven. FIG. 4 is a perspective view illustrating an example of the configuration of the actuator 10. FIG. 5 is an exploded perspective view illustrating an example of the configuration of the actuator 10. The actuator 10 is a multilayer dielectric elastomer actuator (DEA). The actuator 10 is in the form of a rectangular film. Note that, in the present disclosure, a film is defined as including a sheet.

As illustrated in FIG. 3A and FIG. 4, the actuator 10 includes the actuator body 10A, the constraining member (a first constraining member) 14, the constraining member (a second constraining member) 15, an extraction electrode (a first extraction electrode) 16, and an extraction electrode (a second extraction electrode) 17. The extraction electrodes 16 and 17 are electrically connected to a voltage source (not illustrated) through wiring (not illustrated). Due to voltage being applied, the actuator 10 can expand and contract in an in-plane direction of the actuator 10. In other words, the actuator 10 can be displaced in a direction of the thickness of the actuator 10.

As illustrated in FIG. 3B, the actuator 10 makes it possible to reduce a decrease in strain, compared with the actuator 110 of which the first surface S101 and the second surface S102 are entirely constrained (refer to FIG. 1A). In other words, it is possible to reduce a decrease in an amount of displacement of the actuator 10.

The actuator 10 can be applied to various drive apparatuses or various electronic apparatuses. In this case, the actuator 10 is fixed on the base material 22 included in a drive apparatus or an electronic apparatus. Further, the driven body 21 included in the drive apparatus or the electronic apparatus is fixed on the actuator 10. The actuator 10 and the base member 22 are bonded to each other using an adhesive (not illustrated), and the actuator 10 and the driven body 21 are bonded to each other using an adhesive (not illustrated). Note that, in the present disclosure, a pressure-sensitive adhesion is defined as a type of adhesion.

Specific examples of a drive apparatus to which the actuator 10 can be applied include a lens drive apparatus, an apparatus that corrects for a hand induced-shake, and an oscillation device (a tactile display, a vibrator, and an acoustic transducer (such as a speaker)), but the drive apparatus to which the actuator 10 can be applied is not limited thereto. Examples of an electronic apparatus to which the actuator 10 can be applied include a personal computer, a mobile apparatus, a cellular phone, a tablet computer, a display apparatus, an image-capturing apparatus, an audio apparatus, a game machine, industrial equipment, and a robot, but the electronic apparatus to which the actuator 10 can be applied is not limited thereto.

(Actuator Body)

The actuator body 10A is in the form of a rectangular film. The actuator body 10A includes the first and second surfaces S1 and S2 facing each other. The actuator body 10A includes a constraint portion 10B in which the first and second surfaces S1 and S2 are respectively constrained by the constraining members 14 and 15, and an unconstraint portion 10C in which the first and second surfaces S1 and S2 are respectively not constrained by the constraining members 14 and 15. Here, the constraint portion 10B refers to a portion, in the actuator body 10A, that is situated between the constraining members 14 and 15, and the unconstraint portion 10C refers to a portion, in the actuator body 10A, that is provided between the constraint portions 10B being adjacent to each other and is not situated between the constraining members 14 and 15.

As illustrated in FIG. 3A and FIG. 5, the actuator body 10A is a multilayer body, and includes a plurality of elastomer layers 11, a plurality of electrodes (first electrodes) 12, and a plurality of electrodes (second electrodes) 13. From the viewpoint of insulating properties, it is favorable that the first and second surfaces S1 and S2 of the actuator body 10A be covered with the elastomer layer 11.

(Elastomer Layer)

The elastomer layer 11 is elastic in an in-plane direction of the actuator body 10A. The elastomer layer 11 is provided between the electrodes 12 and 13. The elastomer layer 11 is a rectangular film. The elastomer layer 11 is a so-called dielectric elastomer layer. The elastomer layer 11 includes, for example, an insulating elastomer as an insulating elastic material. The insulating elastomer includes, for example, at least one of acrylic rubber, silicone rubber, ethylene-propylene-diene terpolymer (EPDM), natural rubber (NR), butyl rubber (IIR), isoprene rubber (IR), acrylonitrile butadiene rubber (NBR), hydrogenated acrylonitrile butadiene rubber (H—NBR), hydrin rubber, chloroprene rubber (CR), fluororubber, urethane rubber, or the like.

The elastomer layer 11 may include an additive as necessary. For example, the additive is at least one of a crosslinker, a plasticizer, an antioxidant, a surfactant, a viscosity modifier, a reinforcement, a colorant, or the like.

(Electrode)

The electrodes 12 and 13 are elastic in the in-plane direction of the actuator body 10A. This enables the electrodes 12 and 13 to expand and contract in response to the expansion and contraction of the elastomer layer 11. There are a gap between the electrodes 12 and a gap between the electrodes 13 in the in-plane direction of the actuator body 10A. Specifically, each of the electrodes 12 and 13 is a pattern electrode having a stripe pattern. The electrode 13 faces the electrode 12. The electrode 12 and the electrode 13 are alternately arranged in a layered formation such that the elastomer layer 11 is situated between the electrode 12 and the electrode 13. The electrodes 12 and 13 overlap each other, with the elastomer layer 11 being situated between the electrodes 12 and 13. The electrode 12 extends to a first long side of the elastomer layer 11. The electrode 13 extends to a second long side of the elastomer layer 11. Thus, an end of the electrode 12 is exposed from a side surface on the side of a first long side of the actuator body 10A, and an end of the electrode 13 is exposed from a side surface on the side of a second long side of the actuator body 10A.

It is favorable that the electrodes 12 and 13 each have a Young's modulus not greater than ten times the Young's modulus of the elastomer layer 11. When the electrodes 12 and 13 each have a Young's modulus not greater than ten times the Young's modulus of the elastomer layer 11, this makes it possible to reduce a decrease in amounts of deformation of the electrodes 12 and 13 due to the degree of rigidity of the electrodes 12 and 13. The Young's modulus described above is measured on the basis of JIS K 6251: 2010.

The electrodes 12 and 13 include a conductive material. For example, the conductive material is at least one of a conductive filler or a conductive polymer. Examples of the form of a conductive filler include forms of a sphere, an ellipse, a needle, a plate, a scale, a tube, a wire, a rod, and a fiber; an unfixed form; and the like, but the form of a conductive filler is not particularly limited thereto. Note that only a conductive filler of one type may be used, or conductive fillers of two or more types may be used in combination.

For example, the conductive filler includes at least one of a carbon-based filler, a metal-based filler, a metallic-oxide-based filler, or a metal-coated filler. Here, the metal is defined as including a semimetal.

For example, the carbon-based filler includes at least one of carbon black (such as keitjen black and acetylene black), porous carbon, a carbon fiber (such as a PAN-based carbon fiber and a pitch-based carbon fiber), a carbon nanofiber, fullerene, graphene, a vapor-grown carbon fiber (VGCF), a carbon nanotube (such as SWCNT and MWCNT), a carbon microcoil, or a carbon nanohorn.

For example, the metal-based filler includes at least one of copper, silver, gold, platinum, palladium, nickel, tin, cobalt, rhodium, iridium, iron, ruthenium, osmium, manganese, molybdenum, tungsten, niobium, tantalum, titanium, bismuth, antimony, or lead.

For example, the metallic-oxide-based filler includes indium tin oxide (ITO), zinc oxide, indium oxide, antimony-doped tin oxide, fluorine-doped tin oxide, aluminum-doped zinc oxide, gallium-doped zinc oxide, silicon-doped zinc oxide, zinc oxide-tin oxide, indium oxide-tin oxide, or zinc oxide-indium oxide-magnesium oxide.

The metal-coated filler is obtained by coating a base filler with metal. For example, the base filler is mica, a glass bead, a glass fiber, a carbon fiber, calcium carbonate, zinc oxide, or titanium oxide. For example, the metal used to cover the base filler includes at least one of Ni or Al.

For example, the conductive polymer includes at least one of polyethylenedioxythiophene/polystyrene sulfonate (PEDOT/PSS), polyaniline, polyacetylene, or polypyrrole.

The electrodes 12 and 13 may further include at least one of a binder, a gel, a suspension, or an oil as necessary. The binder is elastic. It is favorable that the binder be an elastomer. Examples of the elastomer may include an elastomer similar to an elastomer included in the elastomer layer 11.

The electrodes 12 and 13 may further include an additive as necessary. Examples of the additive may include an additive similar to an additive included in the elastomer layer 11.

The electrodes 12 and 13 may include a composite material. For example, the composite material includes at least one of a composite material of at least one of a conductive polymer or a conductive filler and an elastomer, a composite material of an elastic ion conductive material and an electrolyte, a composite material of at least one of a conductive polymer or a conductive filler and a suspension of a polymer (such as an acrylic emulsion), a composite material of at least one of a conductive polymer or a conductive filler and a block copolymer, or a composite material of a polymer gel and an ion conductor.

(Constraining Member)

The constraining member 14 constrains the first surface S1 from expanding and contracting in the in-plane direction of the actuator body 10A. The constraining member 15 constrains the second surface S2 from expanding and contracting in the in-plane direction of the actuator body 10A.

The constraining member 14 is provided on the first surface S1 of the actuator body 10A. The constraining member 15 is provided on the second surface S2 of the actuator body 10A. The constraining members 14 and 15 are situated across the actuator body 10A from each other. The constraining members 14 and 15 are provided correspondingly to the electrodes 12 and 13. Specifically, the constraining members 14 and 15 are provided to overlap the electrodes 12 and 13 in a direction of the thickness of the actuator body 10A. FIG. 3A, and FIGS. 4 and 5 illustrate an example in which the constraining members 14 and 15 and the electrodes 12 and 13 entirely overlap, but the constraining members 14 and 15 and the electrodes 12 and 13 may partially overlap.

The constraining members 14 and 15 have a pattern similar to the pattern of the electrodes 12 and 13, that is, a stripe pattern.

It is favorable that the constraining members 14 and 15 be harder than the constraint portion 10B of the actuator body 10A. When the constraining members 14 and 15 are harder than the constraint portion 10B, this makes it possible to stabilize driving of the driven body 21 during driving of the actuator 10. A material of the constraining members 14 and 15 is not particularly limited. The constraining members 14 and 15 may be made of an organic material or an inorganic material.

It is favorable that the constraining members 14 and 15 each have a Young's modulus not less than three times the Young's modulus of the actuator body 10A. When the constraining members 14 and 15 each have a Young's modulus not less than three times the Young's modulus of the actuator body 10A, this makes it possible to stabilize driving of the driven body 21 during driving of the actuator 10. The Young's modulus described above is measured on the basis of JIS K 6251:2010.

When a width $w_1$ of a drive portion of the actuator body 10A satisfies $w_{1=1}$, a width $w_2$ of a non-drive portion of the actuator body 10A is favorably satisfies $0.1 \leq w_2 \leq 10$. When the width $w_2$ of the non-drive portion of the actuator body 10A satisfies $w_2 < 0.1$, an amount of displacement is decreased due to the influence of the constraining members 14 and 15. On the other hand, when the width $w_2$ of the drive portion of the actuator body 10A satisfies $10 < w_2$, there is a decrease in the proportion of the drive portion in a cross section that is orthogonal to a drive direction. This results in a decrease in generated force.

when the width $w_1$ of the drive portion of the actuator body 10A satisfies $w_1=1$, a thickness h of the actuator body 10A favorably satisfies $0.1 \leq h \leq 10$. When the thickness h of the actuator body 10A satisfies h<0.1, the amount of displacement is decreased due to the influence of the constraining members 14 and 15. On the other hand, when the thickness h of the actuator body 10A satisfies 10<h, the aspect ratio determined by $w_2/h$ is made smaller, and a generated force escapes in a direction orthogonal to a drive direction. This results in a decrease in the generated force.

As used herein, the width w1 of the drive portion, the width w2 of the non-drive portion, and the thickness h of the actuator body 10A refer to those when the actuator 10 is not driven. As used herein, the drive portion refers to a portion that is included in the actuator body 10A and in which all of the elastomer layer 11 and the electrodes 12 and 13 overlap each other. FIG. 3A illustrates an example in which the constraint portion 10B corresponds to the drive portion. On the other hand, the non-drive portion refers to a portion situated between the drive portions being adjacent to each other. FIG. 3A illustrates an example in which the unconstraint portion 10C corresponds to the non-drive portion.

(Extraction Electrode)

It is favorable that the extraction electrodes 16 and 17 be elastic. This enables the extraction electrodes 16 and 17 to expand and contract in response to the expansion and contraction of the actuator body 10A. This results in being able to prevent the extraction electrodes 16 and 17 from respectively unsticking from the side surface on the side of the first long side of the actuator body 10A and from the side surface on the side of the second long side of the actuator body 10A.

The extraction electrode 16 is provided on the side surface on the side of the first long side of the actuator body 10A. The extraction electrode 16 is in contact with the end of the electrode 12 exposed from the side surface on the side of the first long side of the actuator body 10A. The extraction electrode 17 is provided on the side surface on the side of the second long side of the actuator body 10A. The extraction electrode 17 is in contact with the end of the electrode 13 exposed from the side surface on the side of the second long side of the actuator body 10A.

The extraction electrodes 16 and 17 include a conductive material. Examples of the conductive material may include a conductive material similar to a conductive material included in the electrodes 12 and 13. The extraction electrodes 16 and 17 may include an elastic binder as necessary. The binder is favorably an elastomer. Examples of the elastomer may include an elastomer similar to an elastomer included in the elastomer layer 11.

[Operation of Actuator]

Figure 6:
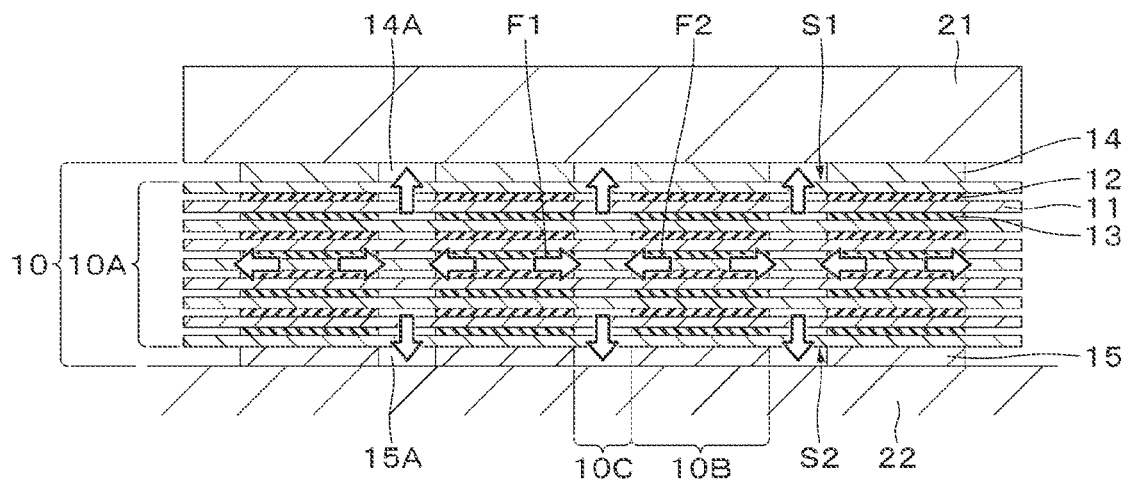
FIG. 6 is a cross-sectional view used to describe an example of an operation of the actuator according to the first embodiment of the present disclosure.

Next, an example of an operation of the actuator 10 according to the first embodiment of the present disclosure is described with reference to FIG. 6.

When a drive voltage is applied between the electrodes 12 and 13, an attractive force due to the Coulomb force acts between the electrodes 12 and 13. For this reason, a portion, in the elastomer layer 11, that is situated between the electrodes 12 and 13 is compressed in a direction of the thickness of the elastomer layer 11 to expand in the in-plane direction of the actuator body 10A. This results in making the portion thinner. Consequently, forces F1 and F2 from the constraint portions 10B respectively situated on two sides of the unconstraint portion 10C act on the unconstraint portion 10C, and the unconstraint portion 10C is compressed in the in-plane direction of the actuator body 10A. In response to the compression, the unconstraint portion 10C expands toward a gap 14A of the constraining member 14 and a gap 15A of the constraining member 15.

Consequently, the constraint portion 10B of the actuator body 10A is made thinner, and the second surface S2, that is, the driven body 21 is displaced downward. As used herein, "downward" refers to a direction of the thickness of the actuator body 10A from the first surface S1 to the second surface S2.

On the other hand, when a drive voltage applied between the electrodes 12 and 13 is turned off, the attractive force due to the Coulomb force does not act between the electrodes 12 and 13. Thus, the portion, in the elastomer layer 11, that is situated between the electrodes 12 and 13 contracts in the in-plane direction of the actuator body 10A, and the thickness of the portion is returned to its original thickness. Consequently, the acting of F1 and F2 on the unconstraint portion 10C is released, and the unconstraint portion 10C in the expanding state is returned to its original state.

Consequently, the thickness of the constraint portion 10B of the actuator body 10A is returned to its original thickness, and the second surface S2, that is, the driven body 21 is displaced upward to be returned to its original position. As used herein, "upward" refers to a direction of the thickness of the actuator body 10A from the second surface S2 to the first surface S1.

Note that, when the actuator 10 is applied to various drive apparatuses or various electronic apparatuses, a default state (an initial state) of the actuator 10 may be a state in which a prescribed voltage is applied to the actuator 10, or may be a state in which voltage is not applied to the actuator 10.

[Method for Producing Actuator]

Next, an example of a method for producing the actuator 10 according to the first embodiment of the present disclosure is described.

(Process of Preparing Coating Used to Form Elastomer Layer)

An elastomer is added to be dispersed in a solvent to prepare a coating used to form an elastomer layer. An additive may be further added to the solvent as necessary. The solvent may be any solvent in which an elastomer or the like can be dispersed, and is not particularly limited.

(Process of Preparing Conductive Coating)

A conductive material is added to be dispersed in a solvent to prepare a conductive coating that corresponds to a coating used to form an electrode. At least one of a binder or an additive may be further added to the solvent as necessary. The solvent may be any solvent in which a conductive material or the like can be dispersed, and is not particularly limited.

(Process of Producing Actuator Body)

The actuator body 10A is produced as indicated below. First, a plate base material is prepared, and a removal treatment is performed on a surface of the base material as necessary. The base material may be an inorganic base material or a plastic base material.

Next, the coating used to form an elastomer layer is applied to one of surfaces of the base material, and is dried. This results in forming the elastomer layer 11 on the one of the surfaces of the base material. Here, the applying includes printing. Next, a treatment of improving adhesion may be performed on the one of the surfaces corresponding to the elastomer layer 11 as necessary.

Next, the conductive coating is applied to the one of the surfaces corresponding to the elastomer layer 11 in stripes, and is dried. This results in forming the electrode 12 on the one of the surfaces corresponding to the elastomer layer 11. Next, a treatment of improving adhesion may be performed, as necessary, on the one of the surfaces corresponding to the elastomer layer 11 on which the electrode 12 has been formed.

Next, the coating used to form an elastomer layer is applied to the one of the surfaces corresponding to the elastomer layer 11 on which the electrode 12 has been formed, and is dried. This results in forming the elastomer layer 11 on the electrode 12. Next, a treatment of improving adhesion may be performed on the one of the surfaces corresponding to the elastomer layer 11 as necessary.

Next, the conductive coating is applied to the one of the surfaces corresponding to the elastomer layer 11 in stripes, and is dried. This results in forming the electrode 13 on the one of the surfaces corresponding to the elastomer layer 11. Next, a treatment of improving adhesion may be performed, as necessary, on the one of the surfaces corresponding to the elastomer layer 11 on which the electrode 13 has been formed.

Next, the coating used to form an elastomer layer is applied to the one of the surfaces corresponding to the elastomer layer 11 on which the electrode 13 has been formed, and is dried. This results in forming the elastomer layer 11 on the electrode 13. Next, a treatment of improving adhesion may be performed on the one of the surfaces corresponding to the elastomer layer 11 as necessary.

Next, the process of forming the electrode 12, the process of forming the elastomer layer 11, and the process of forming the electrode 13 are repeatedly performed to form a multilayer object on the one of the surfaces of the base material. Next, the entirety of, or a portion of the multilayer object is removed from the base material. This results in obtaining the actuator body 10A in the form of a multilayer body.

(Process of Forming Constraining Member)

Subsequently, a coating used to form a constraining member is applied to the first and second surfaces S1 and S2 of the actuator body 10A, and is hardened to form the constraining members 14 and 15. Note that the method for forming the constraining members 14 and 15 is not limited thereto, and, for example, the constraining members 14 and 15 being formed in advance may be respectively bonded to the first and second surfaces S1 and S2 of the actuator body 10A. Alternatively, a thin film may be formed on the first and second surfaces S1 and S2 of the actuator body 10A, and then the thin film may be patterned using, for example, a photolithography technique or an etching technique to form the constraining members 14 and 15. As described above, the target actuator 10 is obtained.

[Effects] In the actuator 10 according to the first embodiment, the constraining members 14 and 15 are provided correspondingly to the electrodes 12 and 13. This makes it possible to reduce a decrease in strain caused when voltage is applied, without the actuator body 10A being arrayed (refer to FIG. 2A). This results in being able to reduce a decrease in an amount of displacement of the actuator 10, while preventing the configuration of the actuator 110 from being made complicated.

Further, the constraining members 14 and 15 can be respectively easily formed on the first and second surfaces S1 and S2 of the actuator body 10A using, for example, applying or bonding. This makes it possible to prevent the production process from being made complicated.

Modifications

First Modification

The example in which the actuator 10 includes the constraining members 14 and 15 has been described in the first embodiment above. However, the driven body 21 may include the constraining member 14. In this case, the constraining member 14 is a convex portion that protrudes toward the first surface S1 of the actuator body 10A. The base member 22 may include the constraining member 15. In this case, the constraining member 15 is a convex portion that protrudes toward the second surface S2 of the actuator body 10A.

Second Modification

Figure 7:
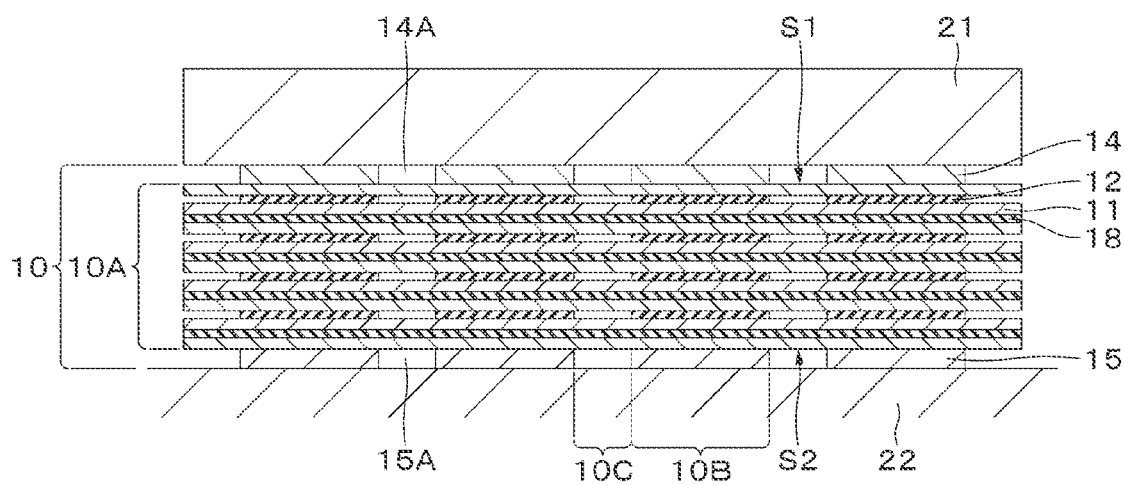
FIG. 7 is a cross-sectional view illustrating an example of a configuration of the actuator according to a modification of the first embodiment of the present disclosure.
Figure 8:
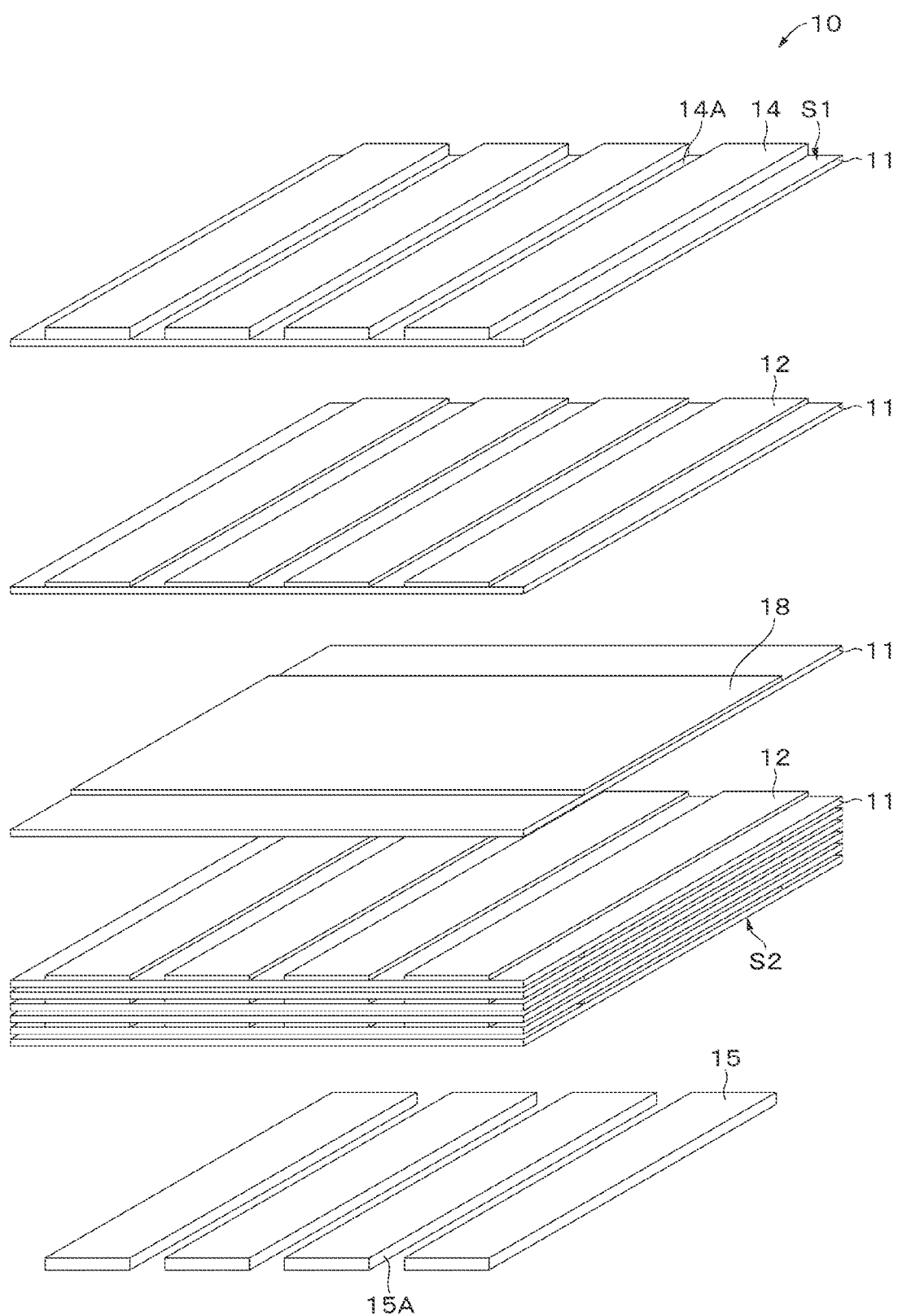
FIG. 8 is an exploded perspective view illustrating the example of the configuration of the actuator according to the modification of the first embodiment of the present disclosure.

The example in which the actuator 10 includes a plurality of electrodes 13 each being a pattern electrode has been described in the first embodiment above. However, the actuator 10 may include a non-pattern electrode 18 that has no pattern, instead of the plurality of electrodes 13, as illustrated in FIGS. 7 and 8. The non-pattern electrode 18 is a layer obtained by continuously forming the plurality of electrodes 13 in the entirety of a facing region. FIGS. 7 and 8 illustrate an example in which the non-pattern electrode 18 is rectangular. However, the shape of the non-pattern electrode 18 is not limited thereto.

The electrode 13 extends to first and second short sides of the elastomer layer 11. Thus, ends of the electrode 13 are respectively exposed from a side surface on the side of the first short side of the actuator body 10A and a side surface on the side of the second short side of the actuator body 10A. The extraction electrode 17 is provided on one of the side surface on the side of the first short side and the side surface on the side of the second short side.

The above-described inclusion of the non-pattern electrode 18 in the actuator 10 makes it possible to make the process of producing the actuator 10 simple.

Third Modification

Figure 9:
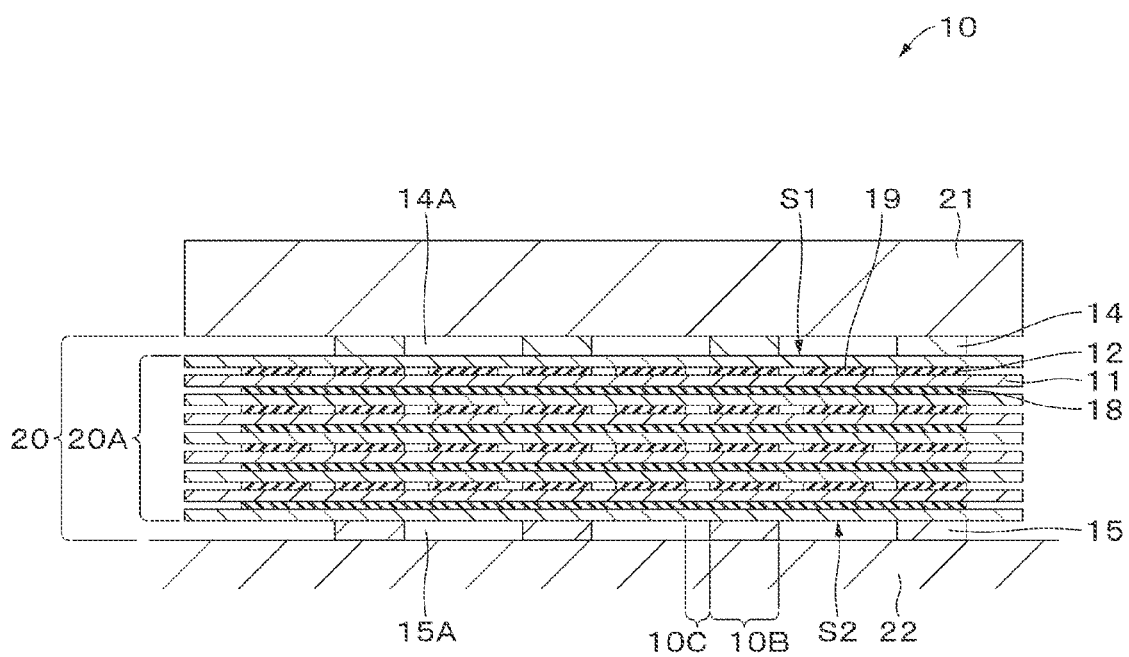
FIG. 9 is a cross-sectional view illustrating an example of a configuration of the actuator according to a modification of the first embodiment of the present disclosure.
Figure 10:
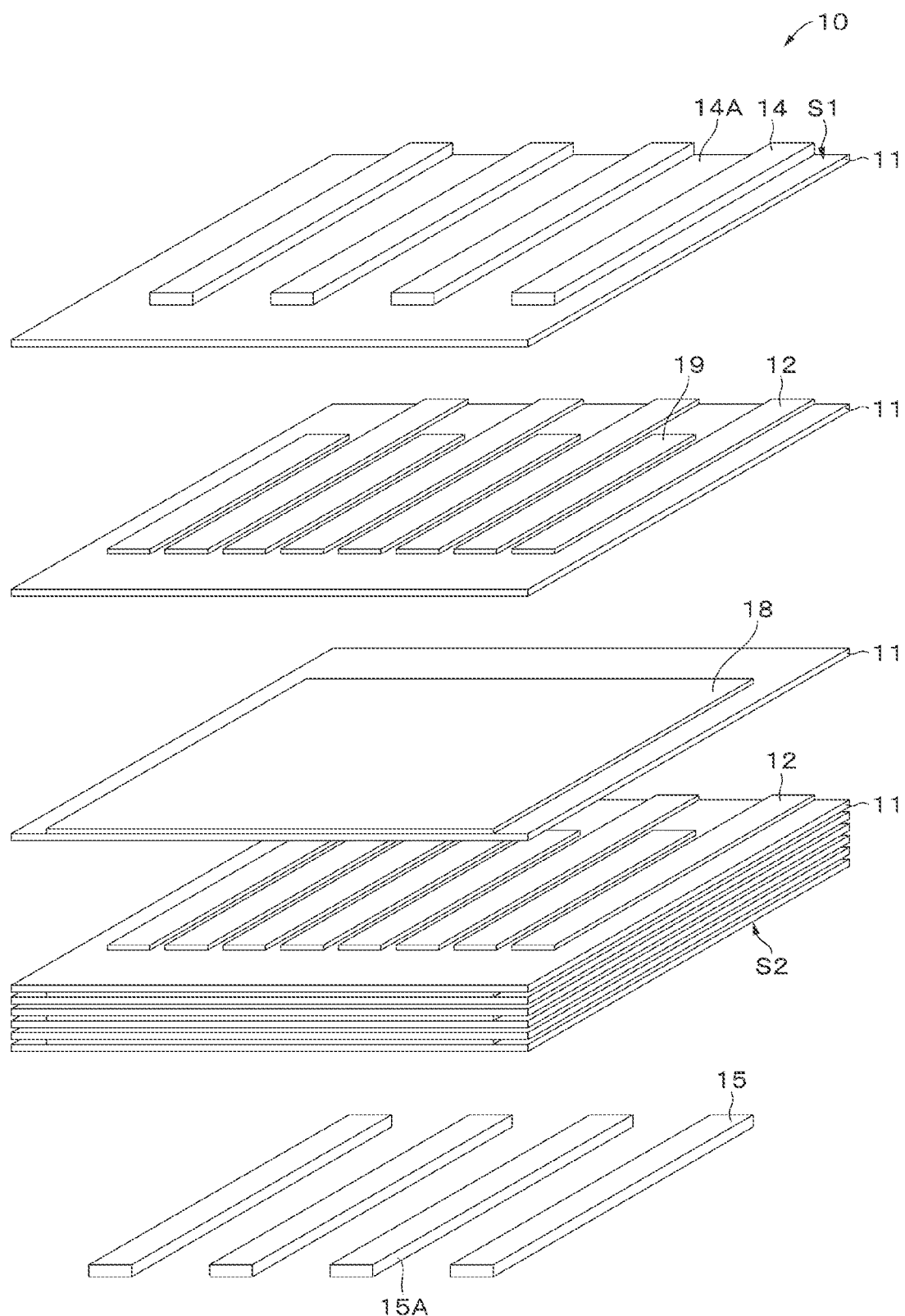
FIG. 10 is an exploded perspective view illustrating the example of the configuration of the actuator according to the modification of the first embodiment of the present disclosure.

The actuator 10 may further include a plurality of dummy electrodes 19, as illustrated in FIGS. 9 and 10. The dummy electrode 19 is elastic in the in-plane direction of the actuator body 10A. The dummy electrode 19 is provided in a gap between the electrodes 12 being adjacent to each other. The dummy electrode 19 is a stripe pattern electrode. The dummy electrode 19 may be made of a material similar to a material of the electrode 12, or a material different from the material of the electrode 12. However, it is favorable that the dummy electrode 19 be made of a material similar to the material of the electrode 12. In this case, the electrode 12 and the dummy electrode 19 can be formed at the same time, and this results in making the process of producing the actuator 10 simple.

The above-described inclusion of the dummy electrode 19 in the actuator 10 makes it possible to prevent a difference in level from being caused in the gap between the electrodes 12. This results in being able to keep the flatness of the elastomer layer 11. Consequently, the actuator 10 of high quality can be provided.

Figure 11A:
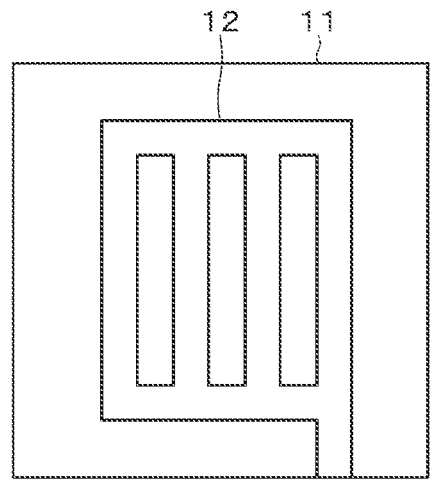
FIGS. 11A and 11B are plan views respectively illustrating examples of a form of the electrode according to a modification.
Figure 11B:
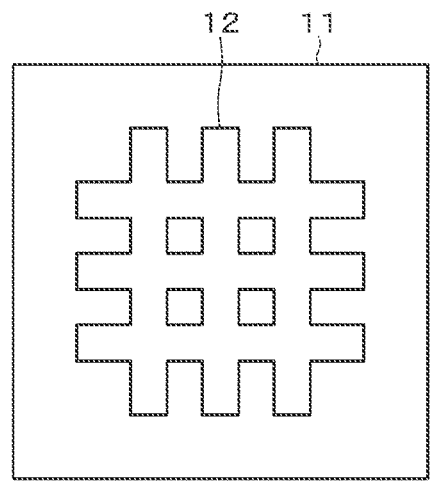
Figure 12A:
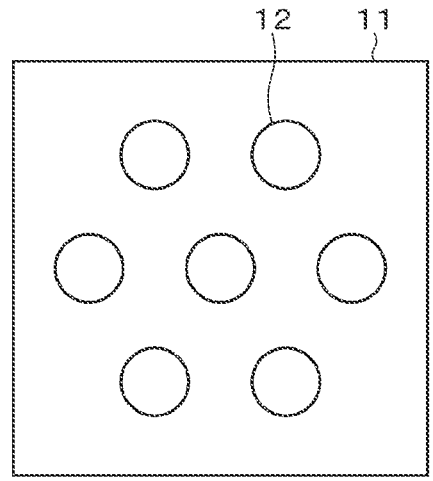
FIGS. 12A and 12B are plan views respectively illustrating examples of the form of the electrode according to the modification.
Figure 12B:
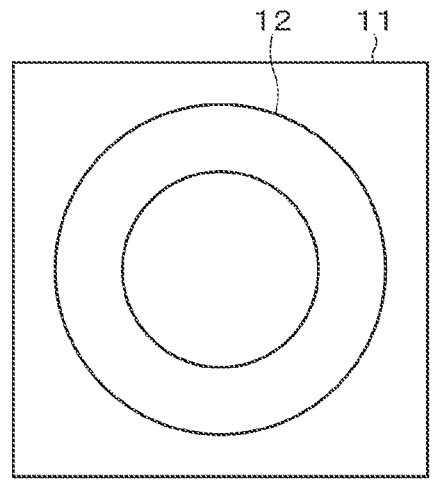

(Fourth Modification) The example in which the electrodes 12 and 13 each have a stripe pattern has been described in the first embodiment above. However, the patterns of the electrodes 12 and 13 are not limited thereto, and various patterns having at least one of a gap or a hole can be used. For example, a mesh pattern (refer to FIG. 11A), a grid pattern (refer to FIG. 11B), a dot pattern (refer to FIG. 12A), a meander pattern, a radial pattern, a geometric pattern, a meander pattern, a concentric pattern (such as a concentric-circle pattern), a spiral pattern, a cobweb pattern, a tree pattern, a fishbone pattern, or a net pattern can be used. Further, the electrodes 12 and 13 each do not necessarily have to have a pattern when the electrodes 12 and 13 each have at least one of a gap or a hole. For example, the electrodes 12 and 13 may have a ring-shape (refer to FIG. 12B). The constraining members 14 and 15 may respectively have shapes similar to the shapes of the electrodes 12 and 13 described above.

Fifth Modification

Figure 13:
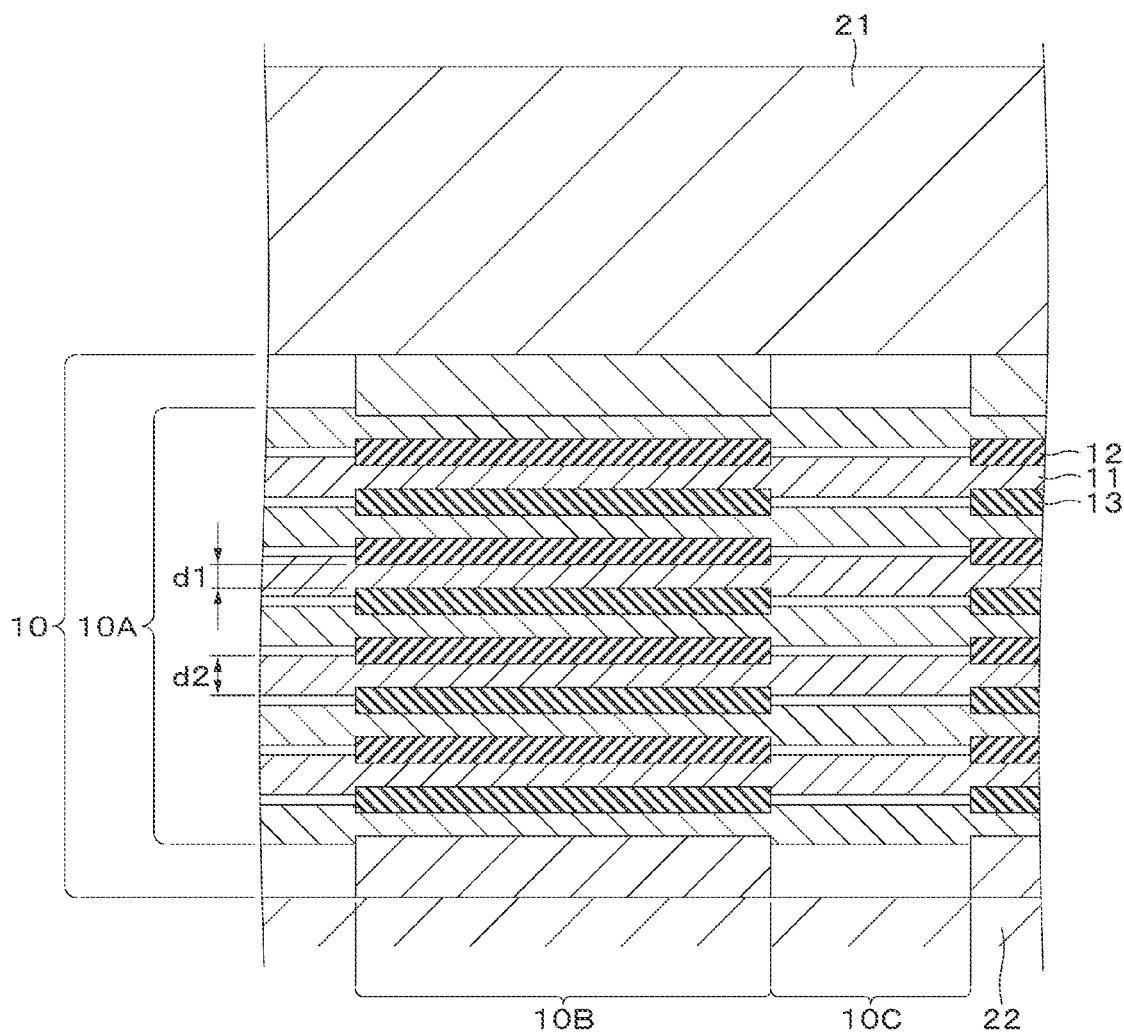
FIG. 13 is an enlarged cross-sectional view illustrating an example of the configuration of the actuator according to a modification of the first embodiment of the present disclosure.

As illustrated in FIG. 13, a thickness d1 of the elastomer layer 11 in the constraint portion 10B may be thinner than a thickness d2 of the elastomer layer 11 in the unconstraint portion 10C. In this case, a drive voltage of the actuator 10 can be reduced.

Figure 14A:
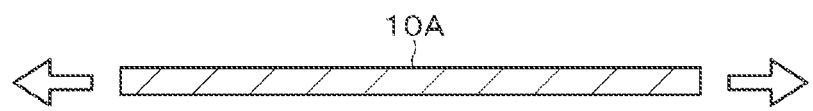
FIGS. 14A, 14B, and 14C are cross-sectional views used to describe an example of a process of producing the actuator according to a modification of the first embodiment of the present disclosure.

For example, the actuator 10 having the configuration described above is produced as indicated below. First, the actuator body 10A is produced as in the case of the first embodiment described above. Next, the actuator body 10A is expanded in the in-plane direction of actuator body 10A, as illustrated in FIG. 14A. The expansion direction is, for example, at least one of a longitudinal direction or a lateral direction of the actuator body 10A having a rectangular shape.

Figure 14B:
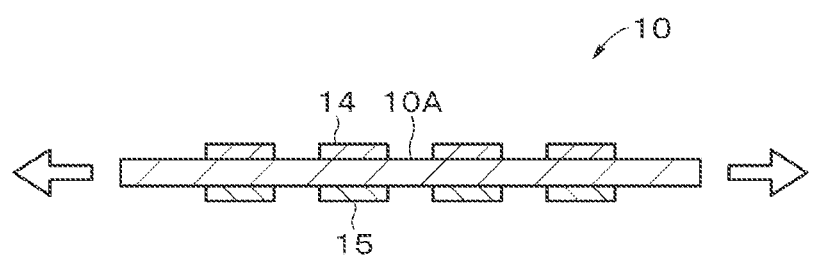
Figure 14C:
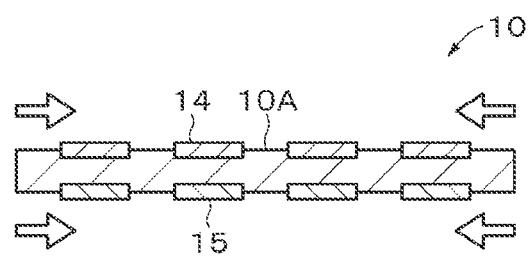

Next, as illustrated in FIG. 14B, the constraining members 14 and 15 are respectively formed on the first and second surfaces S1 and S2 of the actuator body 10A, with the actuator body 10A remaining expanded. Next, the expansion of the actuator body 10A is released, as illustrated in FIG. 14C.

Consequently, the constraint portion 10B remains expanded using the constraining members 14 and 15, whereas the unconstraint portion 10C is returned to its original state. Accordingly, the actuator 10 having the configuration illustrated in FIG. 13 is obtained.

Sixth Modification

Figure 15:
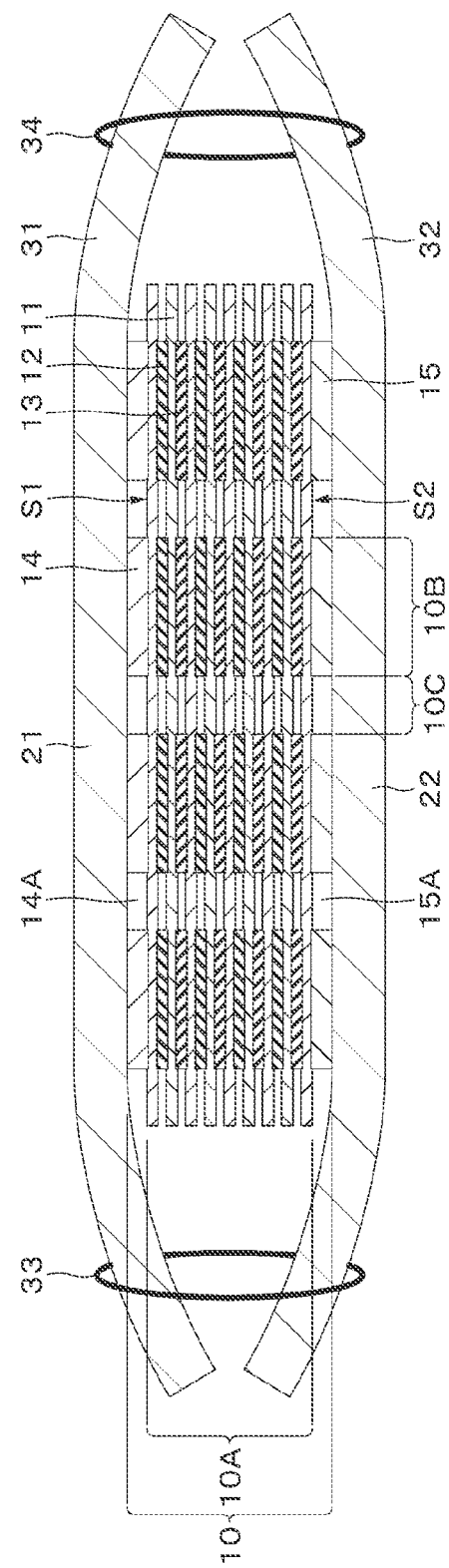
FIG. 15 is a cross-sectional view illustrating an example of the configuration of the actuator according to a modification of the first embodiment of the present disclosure.

The actuator 10 may further include leaf springs 31 and 32 and holding members 33 and 34, as illustrated in FIG. 15. The leaf springs 31 and 32 are sandwiching members between which the actuator body 10A is sandwiched from the side of the first surface S1 through the constraining member 14 and from the side of the second surface S2 through the constraining member 15. The leaf springs 31 and 32 are elongated. The leaf spring 31 is provided to face the first surface S1 of the actuator body 10A. The leaf spring 31 presses the constraining member 14. The leaf spring 32 is provided to face the second surface S2 of the actuator body 10A. The leaf spring 32 presses the constraining member 15. The holding member 33 holds one of two ends of the leaf spring 31 and one of two ends of the leaf spring 32, and the holding member 34 holds another of the two ends of the leaf spring 31 and another of the two ends of the leaf spring 32, such that biasing is performed by the leaf springs 31 and 32 respectively toward the first and second surfaces S1 and S2. The holding members 33 and 34 are ring-shaped elastic members.

In the actuator 10 having the configuration described above, the leaf springs 31 and 32 respectively press the constraining members 14 and 15. Thus, a compressive force is applied to the constraint portion 10B from both of the sides of the first surface S1 and the second surface S2 of the actuator body 10A. Consequently, the thickness d1 of the elastomer layer 11 in the constraint portion 10B is made thinner than the thickness d2 of the elastomer layer 11 in the unconstraint portion 10C (refer to FIG. 13). This makes it possible to reduce a drive voltage of the actuator 10. Further, this results in being able to improve adhesion between the elastomer layer 11 and each of the electrodes 12 and 13. Furthermore, it is also possible to prevent the respective layers forming the actuator body 10A from unsticking from each other, since the actuator body 10A is sandwiched between the leaf springs 31 and 32, and.

Seventh Modification

Figure 16:
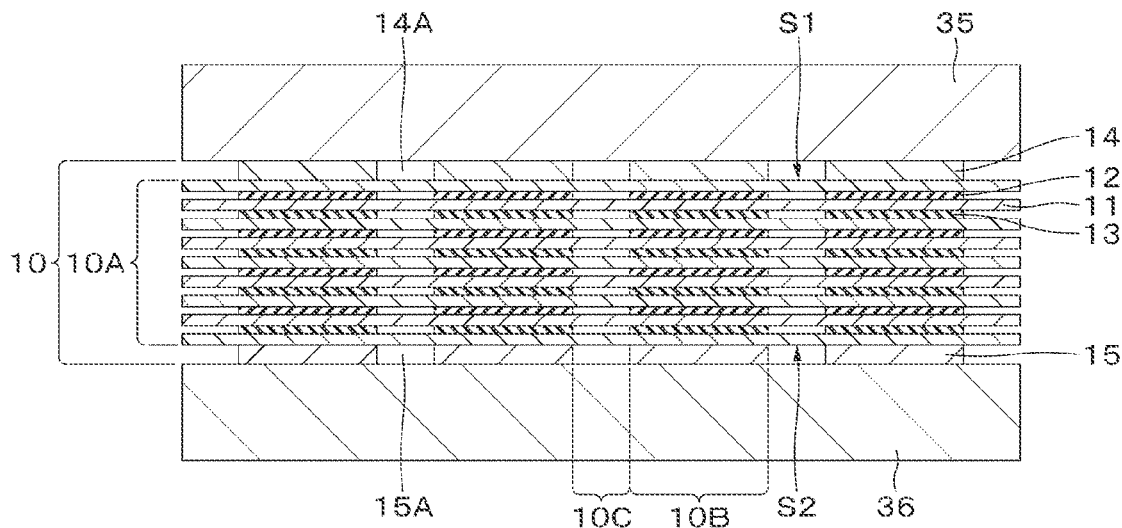
FIG. 16 is a cross-sectional view illustrating an example of the configuration of the actuator according to a modification of the first embodiment of the present disclosure.

As illustrated in FIG. 16, the actuator 10 may further include magnets 35 and 36. The magnets 35 and 36 are sandwiching members between which the actuator body 10A is sandwiched from the side of the first surface S1 through the constraining member 14 and from the side of the second surface S2 through the constraining member 15. The magnets 35 and 36 attract each other. The magnet 35 is provided to face the first surface S1 of the actuator body 10A. The magnet 35 presses the constraining member 14. The magnet 36 is provided to face the second surface S2 of the actuator body 10A. The magnet 36 presses the constraining member 15.

In the actuator 10 having the configuration described above, the magnets 35 and 36 respectively press the constraining members 14 and 15. Thus, effects similar to the effects provided by the sixth modification can be provided.

Eighth Modification

Figure 17:
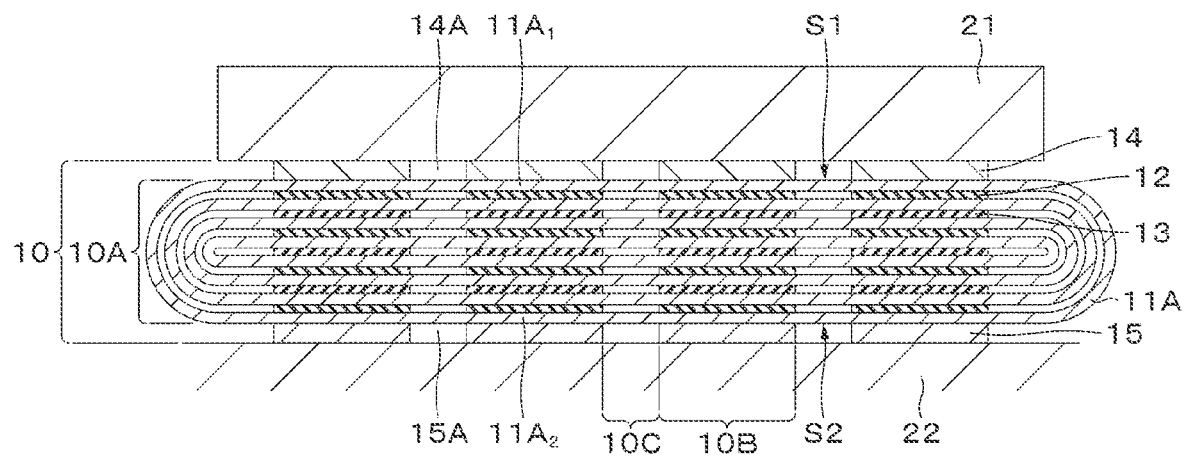
FIG. 17 is a cross-sectional view illustrating an example of the configuration of the actuator according to a modification of the first embodiment of the present disclosure.

The example in which the actuator body 10A includes a plurality of rectangular elastomer layers 11 has been described in the first embodiment above. However, the actuator body 10A may include a plurality of looped elastomer layers 11A, as illustrated in FIG. 17. The elastomer layers 11A of the plurality of elastomer layers 11A are concentrically arranged in a layered formation. A semi-circumferential portion of the innermost elastomer layer 11A is folded such that fold portions of the semi-circumferential portion overlap, with a plurality of electrodes 13 being situated between the fold portions. The electrodes 12 and 13 are alternately arranged in a layered formation such that the elastomer layer 11A is situated between the electrodes 12 and 13. The constraining member 14 is provided on an outer peripheral surface of one of semi-circumferential portions of the outermost elastomer layer 11A, and the constraining member 15 is provided on an outer peripheral surface of another of the semi-circumferential portions of the outermost elastomer layer 11A.

Figure 18:
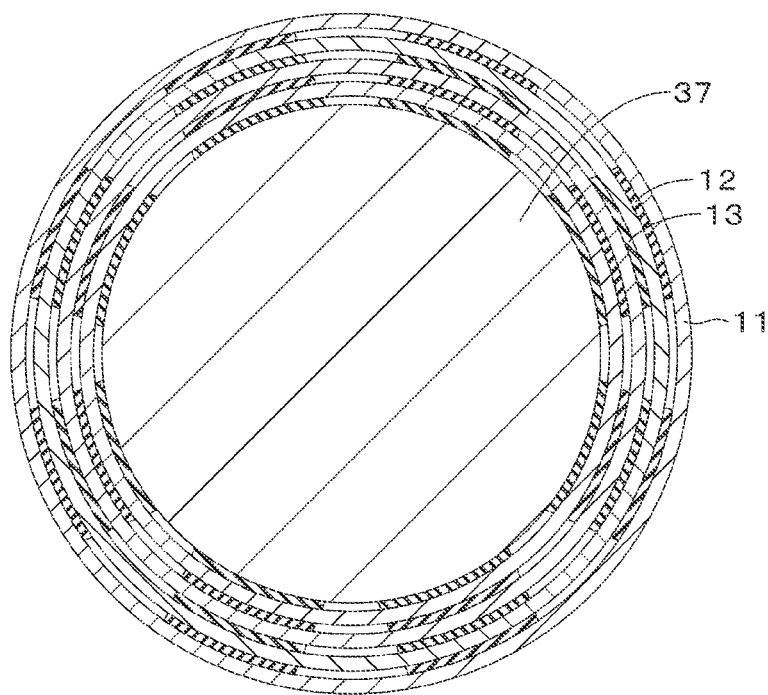
FIG. 18 is a cross-sectional view used to describe an example of a method for producing the actuator according to the modification of the first embodiment of the present disclosure.

An example of a method for producing the actuator body 10A having the configuration described above is described below with reference to FIG. 18. First, a cylindrical base material 37 is prepared, and a removal treatment is performed on a peripheral surface (a cylindrical surface) of the base material 37 as necessary. Next, a conductive coating is applied to the peripheral surface of the base material 37 to form a stripe coating film parallel to a central axis of the base material 37. Subsequently, the coating film formed on the peripheral surface of the base material 37 is dried. This results in forming the electrode 13 on the peripheral surface of the base material 37. Next, a treatment of improving adhesion may be performed on the surface of the electrode 13 as necessary.

Next, a coating used to form an elastomer layer is applied to the peripheral surface of the base material 37 to form a cylindrical coating film. Subsequently, the coating film formed on the peripheral surface of the base material 37 is dried. This results in forming the elastomer layer 11 on the electrode 13. Next, a treatment of improving adhesion may be performed on one of the surfaces of the elastomer layer 11 as necessary.

Next, the electrode 12 is formed on a peripheral surface of the elastomer layer 11 as in the case of the process of forming the electrode 13 described above.

Next, the process of forming the electrode 13, the process of forming the elastomer layer 11, and the process of forming the electrode 12 are repeatedly performed to form a multilayer object on the peripheral surface of the base material 37. Thereafter, the entirety of, or a portion of the multilayer object is removed from the base material 37. This results in obtaining the looped actuator body 10A.

Ninth Modification

The example in which the rectangular elastomer layer 11 and the stripe electrode 12, 13 are alternately arranged in a layered formation to form the rectangular actuator body 10A has been described in the first embodiment above. However, the method for producing the actuator body 10A is not limited thereto.

For example, a looped multilayer object (the actuator body 10A) may be produced, as described in the eighth modification, and then, the produced multilayer object may be cut and spread to produce the rectangular actuator body 10A.

Tenth Modification

Figure 19:
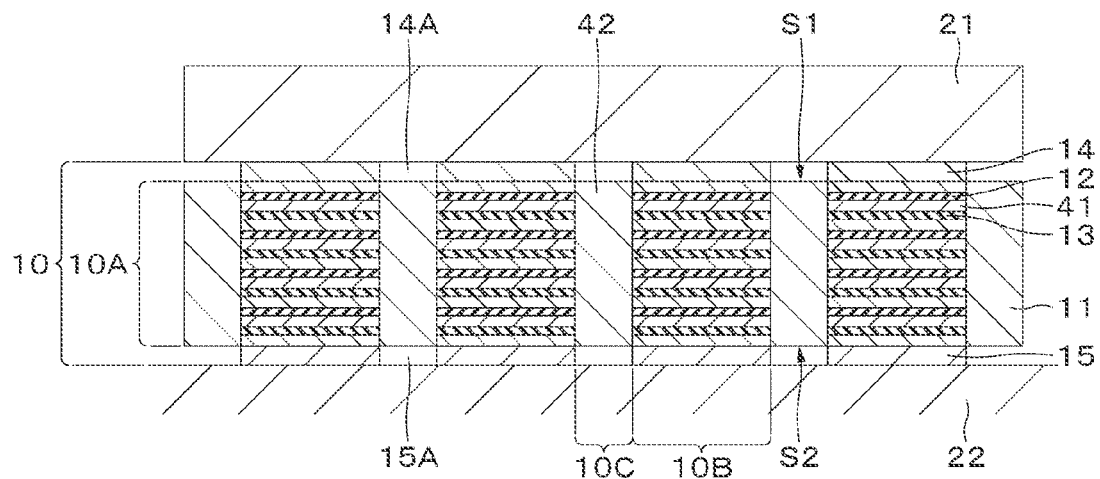
FIG. 19 is a cross-sectional view illustrating an example of the configuration of the actuator according to a modification of the first embodiment of the present disclosure.

The example in which the actuator 10 includes a plurality of elastomer layers 11 has been described in the first embodiment above. However, instead of the plurality of elastomer layers 11, a plurality of elastomer layers 41 and a plurality of elastomer layers 42 may be included, as illustrated in FIG. 19.

The elastomer layer 41 is similar to the elastomer layer 11 in the first embodiment, except that the elastomer layer 41 has the same size or substantially the same size as the electrode 12, 13. The constraint portion 10B is a multilayer object that includes a plurality of electrodes 12, a plurality of electrodes 13, and a plurality of elastomer layers 41.

The elastomer layer 42 is provided between the constraint portions 10B being adjacent to each other in the in-plane direction of the actuator body 10A. The elastomer layer 42 may have a single layer structure or a multilayer structure. The unconstraint portion 10C includes the elastomer layer 42.

Figure 20A:
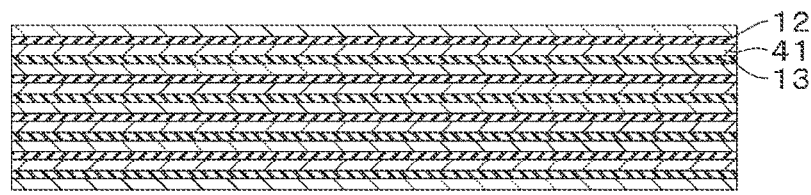

The actuator 10 having the configuration described above is produced as indicated below. First, a multilayer object that includes the elastomer layer 11 and the electrodes 12 and 13 of the same size is formed such that the elastomer layer 11 is situated between the electrodes 12 and 13, as illustrated in FIG. 20A.

Figure 20B:
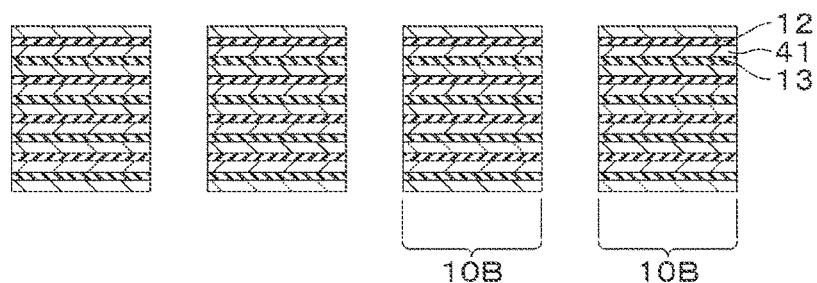
Figure 20C:
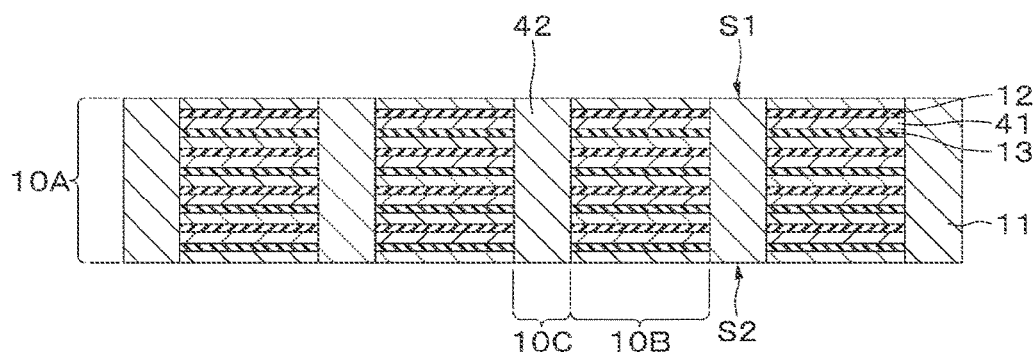

Next, as illustrated in FIG. 20B, a plurality of multilayer objects each forming the constraint portion 10B is cut out and placed on a base material (not illustrated) in a line at regular intervals. Next, as illustrated in FIG. 20C, a space between the adjacent constraint portions 10B is filled with a coating used to form an elastomer layer, and then, the coating used to form an elastomer layer is hardened. This results in forming a plurality of unconstraint portions 10C. Next, the integrated plurality of constraint portions 10B and plurality of unconstraint portions 10C are removed from the base material (not illustrated). Accordingly, the target actuator body 10A is obtained.

<2. Second Embodiment> [Configuration of Actuator]

Figure 21:
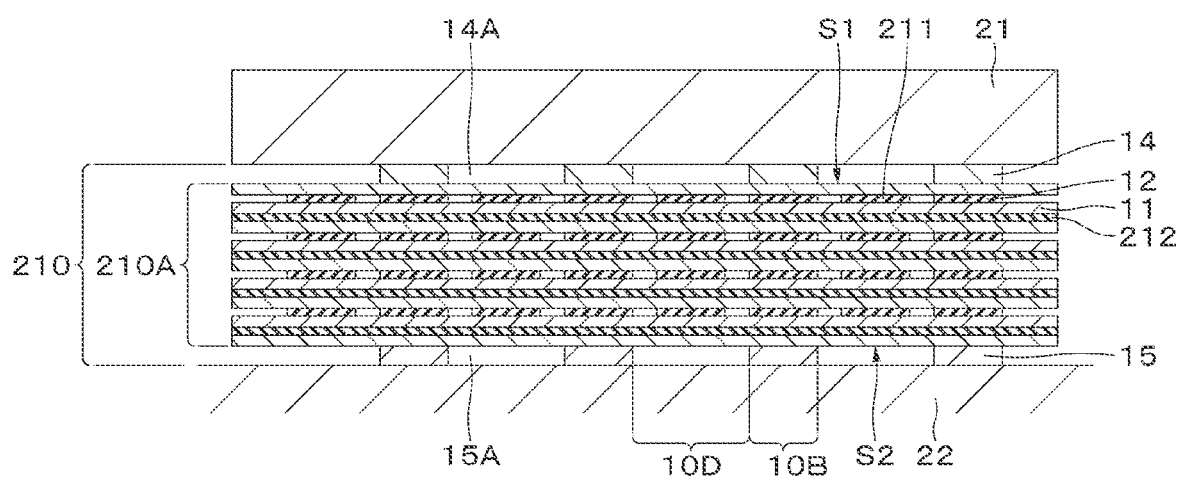
FIG. 21 is a cross-sectional view illustrating an example of a configuration of an actuator according to a second embodiment of the present disclosure.
Figure 22:
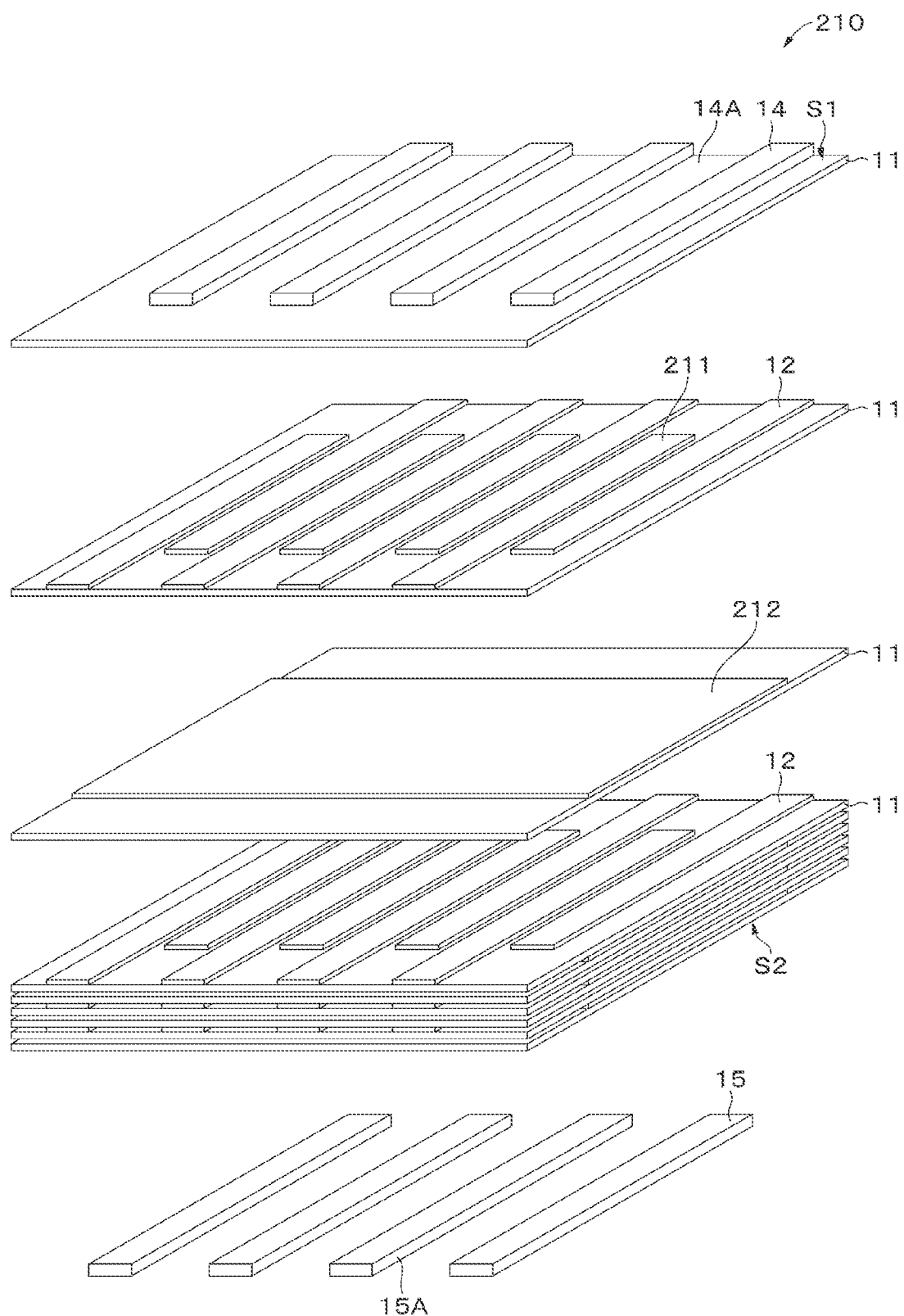
FIG. 22 is an exploded perspective view illustrating an example of the configuration of the actuator according to the second embodiment of the present disclosure.

FIG. 21 is a cross-sectional view illustrating an example of a configuration of an actuator 210 according to a second embodiment of the present disclosure. FIG. 22 is an exploded perspective view illustrating the example of the configuration of the actuator 210. The actuator 210 includes an actuator body 210A instead of the actuator body 10A of the first embodiment (refer to FIG. 3A, and FIG. 5). The actuator body 210A is different from the actuator body 10A of the first embodiment in further including a plurality of electrodes (third electrodes) 211, and in including an electrode 212 instead of a plurality of electrodes 13 (refer to FIG. 3A, and FIG. 5). Note that a portion of the second embodiment that is similar to a portion of the first embodiment is denoted by the same reference numeral as the first embodiment, and the description thereof is omitted.

The electrode 211 is elastic in the in-plane direction of the actuator body 10A. Specifically, the electrode 211 is a pattern electrode having a stripe pattern. The electrode 211 is provided in a gap between the electrodes 12 being adjacent to each other, and is situated across the elastomer layer 11 from the electrode 212. The electrode 211 extends to the second long side of the elastomer layer 11. Thus, an end of the electrode 211 is exposed from a side surface on the side of a second long side of the actuator body 10A. In the second embodiment, the extraction electrode 17 is an extraction electrode of the plurality of electrodes 211. A material of the electrode 211 is similar to the material of the electrodes 12 and 13 of the first embodiment.

The electrode 212 is similar to the non-pattern electrode 18 of the second modification of the first embodiment (refer to FIGS. 7 and 8).

[Operation of Actuator]

Next, an example of an operation of the actuator 210 according to the second embodiment of the present disclosure is described.

Figure 23A:
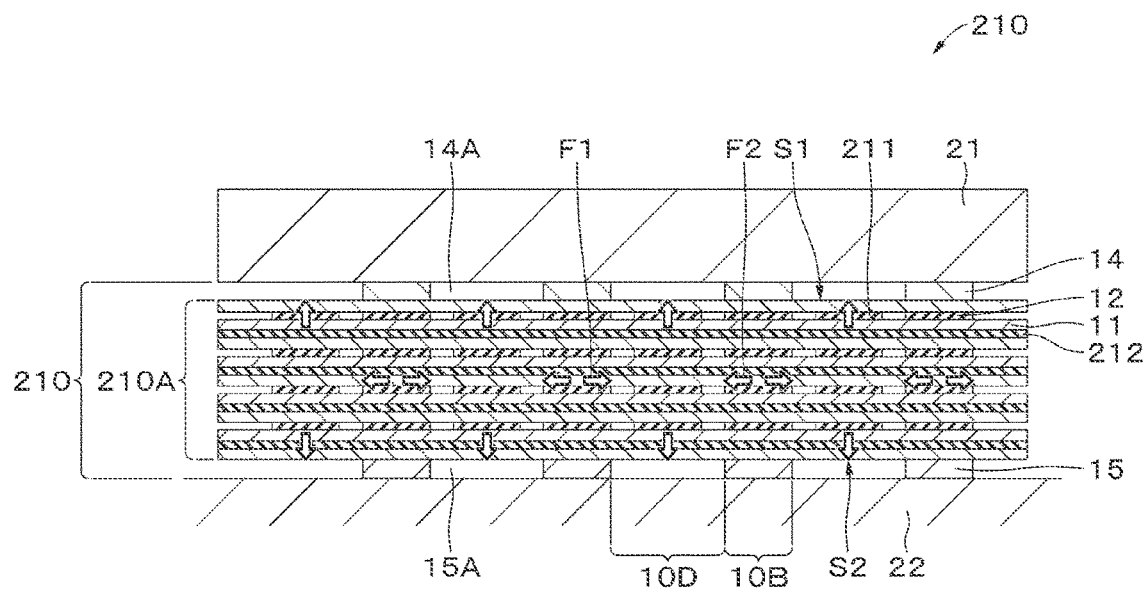
FIGS. 23A and 23B are cross-sectional views used to describe an example of an operation of the actuator according to the second embodiment of the present disclosure.

When a drive voltage is not applied between the electrodes 211 and 212 and when a drive voltage is applied between the electrodes 12 and 212, an attractive force due to the Coulomb force only acts between the electrodes 12 and 212 from among a space between the electrodes 211 and 212 and a space between the electrodes 12 and 212. For this reason, a portion, in the elastomer layer 11, that is situated between the electrodes 12 and 212 expands in an in-plane direction of the actuator body 210A. This results in making the portion thinner. Due to the expansion, forces F1 and F2 from the constraint portions 10B respectively situated on two sides of an unconstraint portion 10D act on the unconstraint portion 10D, as illustrated in FIG. 23A. Due to the action of the forces F1 and F2, the unconstraint portion 10D is compressed in the in-plane direction of the actuator body 10A. In response to the compression, the unconstraint portion 10D expands toward the gaps 14A and 15A, and this results in an increase in the thickness of the unconstraint portion 10D. Thus, a first surface S1 of the actuator body 210A is displaced downward from its initial position, and the driven body 21 moves downward from its initial position. Here, the initial position refers to a position when no drive voltage is applied between the electrodes 211 and 212 and between the electrodes 12 and 212.

Figure 23B:
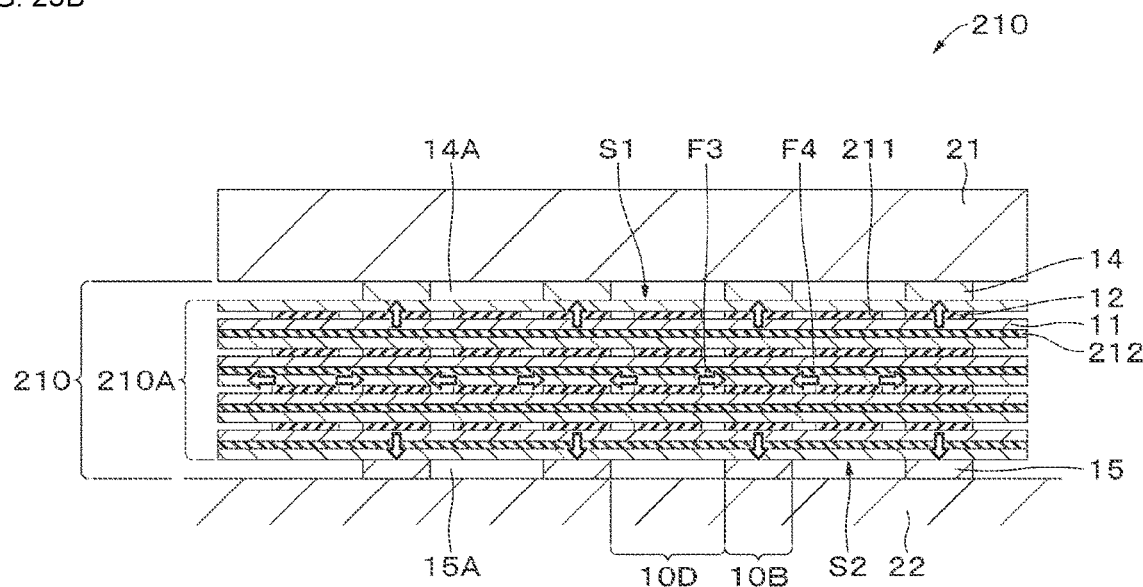

On the other hand, when a drive voltage applied between the electrodes 12 and 212 is turned off and when a drive voltage is applied between the electrodes 211 and 212, an attractive force due to the Coulomb force only acts between the electrodes 211 and 212 from among the space between the electrodes 12 and 212 and the space between the electrodes 211 and 212. For this reason, a portion, in the elastomer layer 11, that is situated between the electrodes 211 and 212 expands in the in-plane direction of the actuator body 210A. This results in making the portion thinner. Due to the expansion, forces F3 and F4 from the constraint portions 10D respectively situated on two sides of the unconstraint portion 10B act on the unconstraint portion 10B, as illustrated in FIG. 23B. Due to the action of the forces F3 and F4, the unconstraint portion 10B is compressed in the in-plane direction of the actuator body 10A. In response to the compression, the thickness of the unconstraint portion 10B is increased. Accordingly, the thickness of the unconstraint portion 10B of the actuator body 10A is increased, and the first surface S1 is displaced upward from its initial position, and the driven body 21 moves upward from its initial position.

[Effects]

As described above, the actuator 210 according to the second embodiment further includes a plurality of electrodes 211, and the electrode 211 is provided in a gap between the electrodes 12 being adjacent to each other. Consequently, when a drive voltage is not applied between the electrodes 211 and 212 and when a drive voltage is applied between the electrodes 12 and 212, the thickness of the constraint portion 10B is reduced, and the constraint portion 10B is displaced downward from its initial position. When a drive voltage applied between the electrodes 12 and 212 is turned off and when a drive voltage is applied between the electrodes 211 and 212, the thickness of the constraint portion 10B is increased, and the constraint portion 10B is displaced upward from its initial position. Consequently, the actuator 210 according to the second embodiment makes it possible to increase an amount of displacement of the driven body 21, compared with the actuator 10 according to the first embodiment.

Modifications

Instead of the electrode 212 being a non-pattern electrode, a plurality of first electrodes each having a stripe pattern and a plurality of second electrodes each having a stripe pattern may be included, the plurality of first electrodes respectively facing a plurality of electrodes 12, the plurality of second electrodes respectively facing a plurality of electrodes 211. In this case, the constraint portion 10B is driven by voltage being applied between the electrode 12 and the first electrode, and the unconstraint portion 10D is driven by voltage being applied between the electrode 211 and the second electrode.

<3. Application Example>

Figure 24:
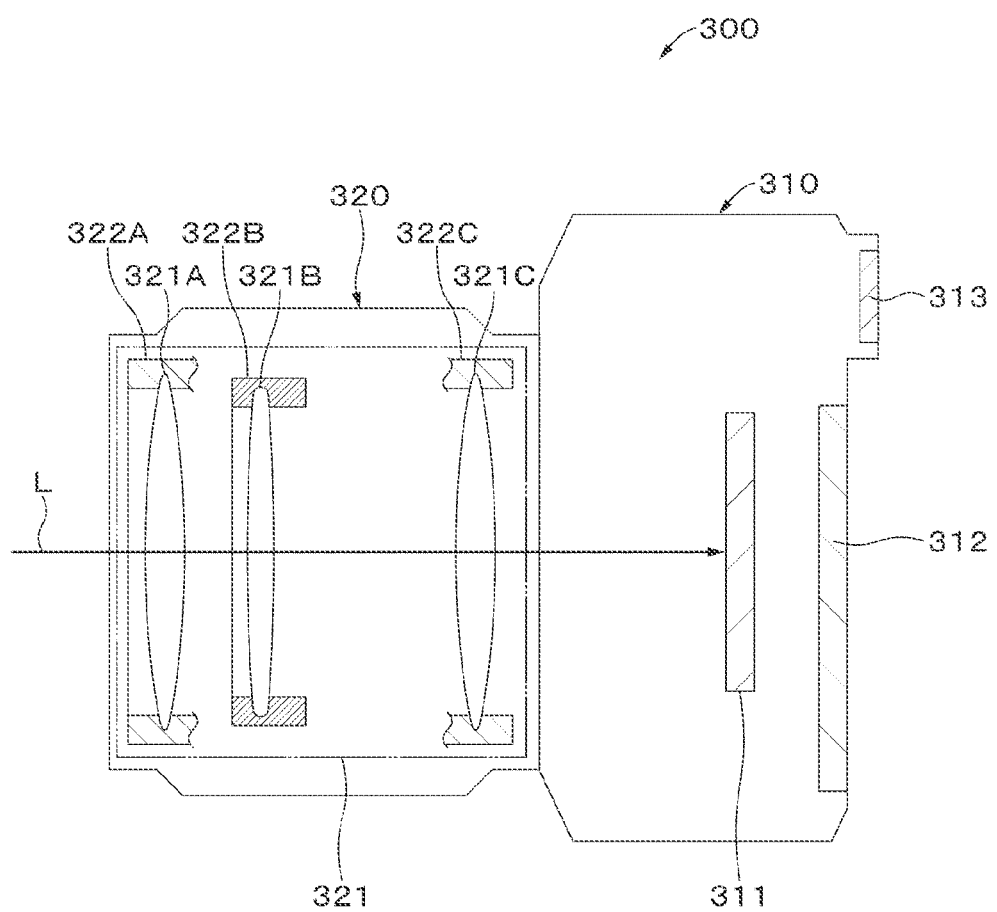
FIG. 24 is a cross-sectional view illustrating an example of a configuration of an image-capturing apparatus as an application example.

FIG. 24 is a cross-sectional view illustrating an example of a configuration of an image-capturing apparatus 300 as an application example. The image-capturing apparatus 300 is a so-called single-lens reflex camera, and includes a camera body 310 and an image-capturing lens 320 that is removable from the camera body. The image-capturing apparatus 300 is an example of an electronic apparatus.

(Camera Body)

The camera body 310 includes, for example, an imaging device 311, a monitor 312, and an electronic viewfinder 313. The imaging device 311 performs a photoelectric conversion on an optical image of a subject to generate a captured-image signal, the optical image of a subject being formed by light L that passes through the image-capturing lens 320 to enter the imaging device 311. The imaging device 311 is, for example, a CCD image sensor or a CMOS image sensor.

Image processing such as a resolution conversion is performed by an image processor (of which an illustration is omitted) on the captured-image signal output by the imaging device 311, and display on the monitor 312 and the electronic viewfinder 313 is performed with respect to the captured-image signal. Further, when a shutter button is pressed, compression processing and record-and-encode processing are performed on the captured-image signal, and then, the captured-image signal is stored in a recording medium (not illustrated).

The monitor 312 and the electronic viewfinder 313 are display apparatuses such as an organic electroluminescence (EL) display or a liquid crystal display.

(Image-Capturing Lens)

The image-capturing lens 320 includes, for example, a lens optical system 321 and a lens controller (not illustrated). The lens optical system 321 includes, for example, a plurality of lens 321A, 321B, and 321C, and a plurality of holders (support members) 322A, 322B, and 322C respectively supporting the lenses 321A, 321B, and 321C. The holder 322A includes a plurality of actuators 10 according to the first embodiment or one of the modifications of the first embodiment, and supports the lens 321A through the plurality of actuators 10. However, the holder 322A may include the actuator 110 according to the second embodiment or the modification of the second embodiment instead of the actuator 10 according to the first embodiment or one of the modifications of the first embodiment.

Figure 25A:
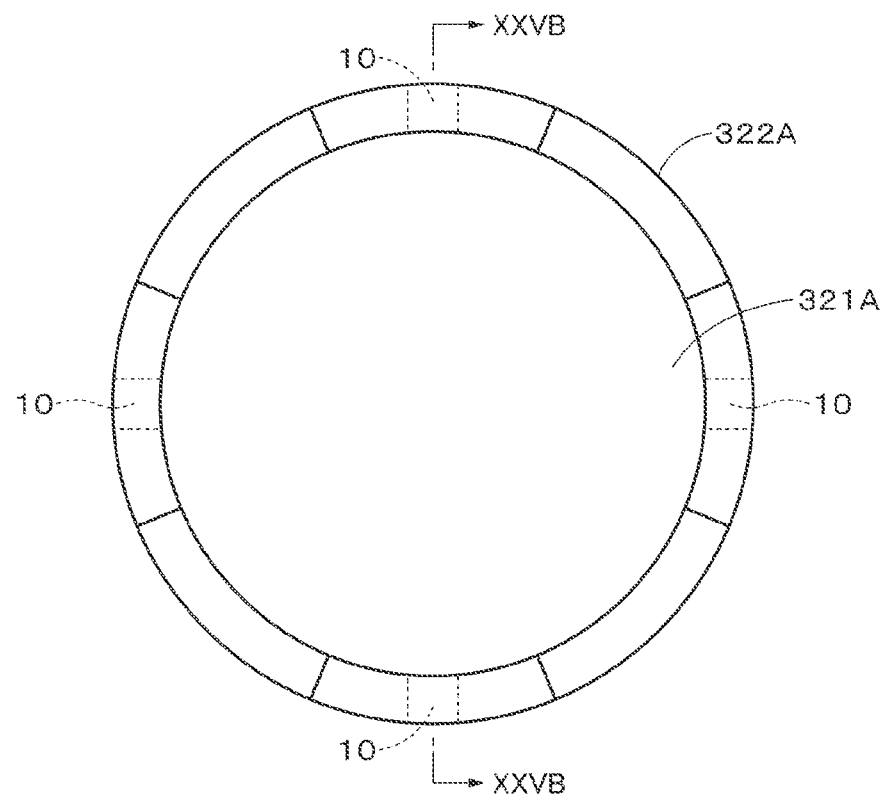
FIG. 25A is a plan view illustrating an example of a configuration of a lens and a holder that holds the lens.
Figure 25B:
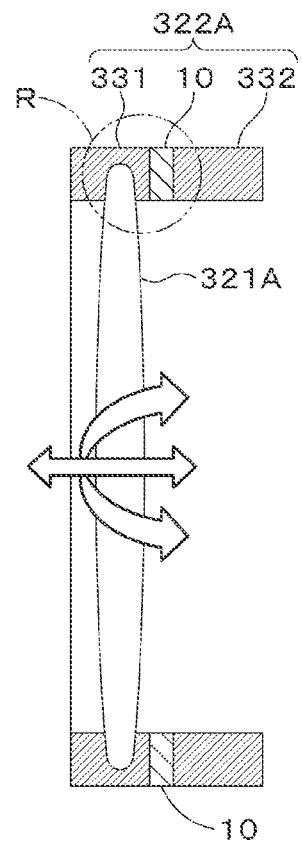
FIG. 25B is a cross-sectional view along the line XXVB-XXVB in FIG. 25A.
Figure 26:
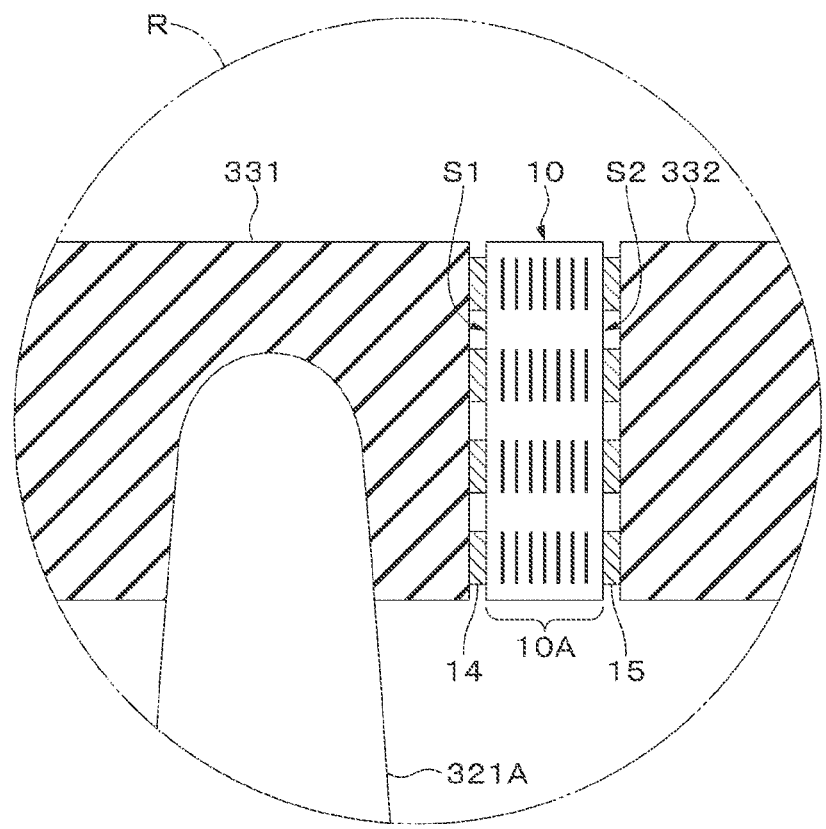
FIG. 26 is an enlarged cross-sectional view of a region R in FIG. 25B.

FIG. 25A is a plan view illustrating an example of a configuration of the lens 321A and the holder 322A that holds the lens 321A. FIG. 25B is a cross-sectional view along the line XXVB-XXVB in FIG. 25A. FIG. 26 is an enlarged cross-sectional view of a region R in FIG. 25B. The lens 321A is a lens for autofocus purpose. The holder 322A includes a lens support 331, a plurality of actuators 10, and a holder body 332.

The lens support 331 has a ring shape. The lens support 331 supports the lens 321A with its inner peripheral surface. A driven body is formed by the lens support 331 and the lens 321A. The holder body 332 has a ring shape. The holder body 332 supports the lens support 331 through the plurality of actuators 10. The holder body 332 is an example of a base material that supports the driven body formed by the lens support 331 and the lens 321A.

The actuator 10 is an actuator for autofocus purpose. The actuator 10 moves the lens 321A in a direction of an optical axis corresponding to incident light L. The first surface S1 of the actuator 10 is fixed to the lens support 331 through a plurality of constraining members 14. The second surface S2 of the actuator 10 is fixed to the holder body 332 through a plurality of constraining members 15.

The lens 321C is a lens used to correct for a hand induced-shake. The holder 322C includes an actuator that corrects for a hand induced-shake (not illustrated). The actuator that corrects for a hand induced-shake moves the lens 321C in a plane orthogonal to the optical axis corresponding to the incident light L.

The lens controller controls the actuator 10 for autofocus purpose and the actuator that corrects for a hand induced-shake.

The example in which the actuator 10 includes the constraining member 14 on the first surface S1 has been described in the application example above. However, the lens support 331 may include the constraining member 14 on a surface of the lens support 331 that faces the first surface S1 of the actuator 10. The example in which the actuator 10 includes the constraining member 15 on the second surface S2 has been described in the application example above. However, the holder body 332 may include the constraining member 15 on a surface of the holder body 332 that faces the second surface S2 of the actuator 10.

4. Application Example

Figure 27:
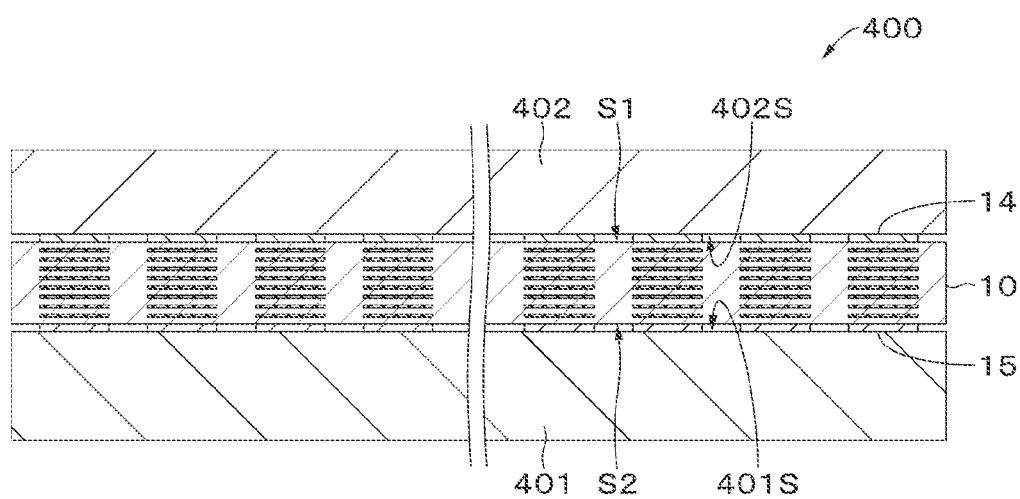
FIG. 27 is a cross-sectional view illustrating an example of a configuration of a display apparatus as an application example.

FIG. 27 is a cross-sectional view illustrating an example of a configuration of a display apparatus 400 as an application example. The display apparatus 400 is a so-called flat speaker, and includes, for example, a back chassis 401, a display panel 402, the actuator 10 according to the first embodiment or one of the modifications of the first embodiment, and a controller (not illustrated). Although the display apparatus 400 includes a single actuator 10 in FIG. 27, the display apparatus 400 may include a plurality of actuators 10. The display apparatus 400 may include the actuator 110 according to the second embodiment or the modification of the second embodiment instead of the actuator 10 according to the first embodiment or one of the modifications of the first embodiment. The display apparatus 400 is an example of an electronic apparatus or a drive apparatus.

The back chassis 401 is an example of a base material that supports the actuator 10, and forms a back surface of the display apparatus 400. The back chassis 401 is provided on the second surface S2 of the actuator 10. The back chassis 401 includes a support surface 401S that faces the display panel 402.

The display panel 402 is an example of a driven body driven by the actuator 10, and is, for example, an organic EL panel or a liquid crystal panel. The display panel 402 is provided on the first surface S1 of the actuator 10. The display panel 402 includes a back surface 402S that faces the back chassis 401.

The second surface S2 of the actuator 10 is fixed to the support surface 401S through a plurality of constraining members 15. The first surface S1 of the actuator 10 is fixed to the back surface 402S through a plurality of constraining members 14. The actuator 10 drives the display panel 402 to emit a plane wave (a sound wave). The controller controls driving of the display panel 402 and the actuator 10.

The example in which the actuator 10 includes the constraining member 14 on the first surface S1 has been described in the application example above. However, the display panel 402 may include the constraining member 14 on the back surface 402S facing the first surface S1 of the actuator 10. The example in which the actuator 10 includes the constraining member 15 on the second surface S2 has been described in the application example above. However, the back chassis 401 may include the constraining member 15 on the support surface 401S facing the second surface S2 of the actuator 10.

5. Application Example

Figure 28:
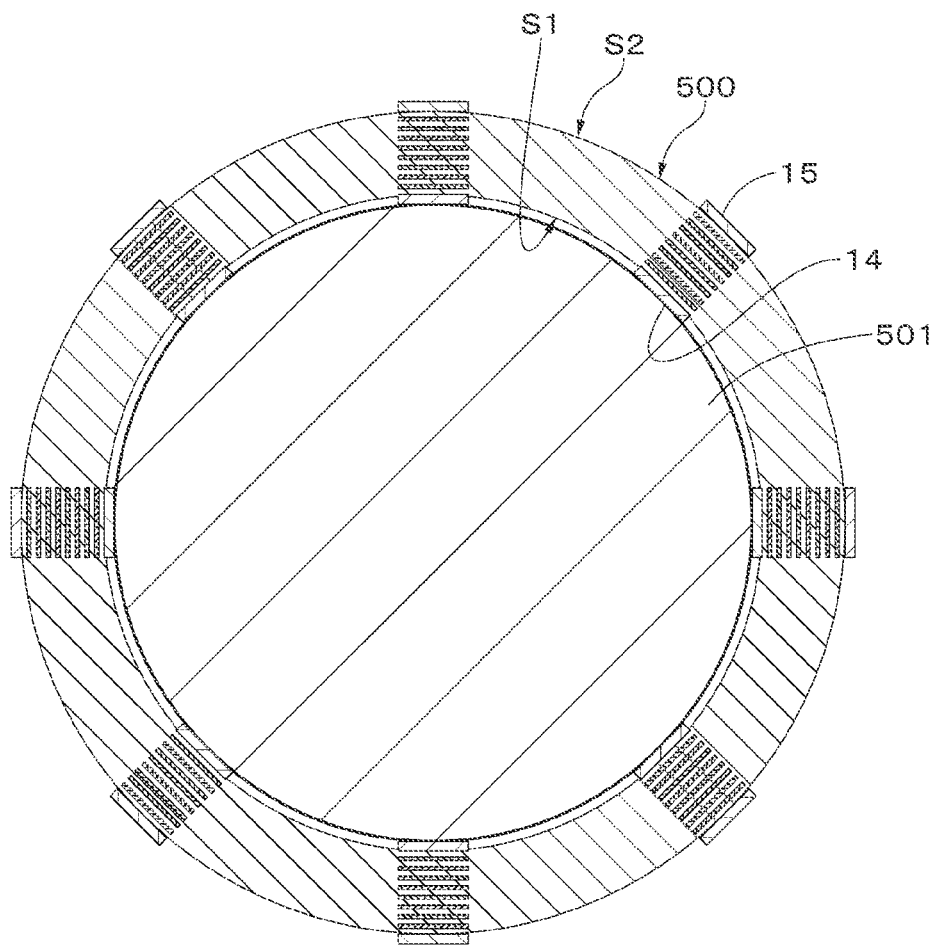
FIG. 28 is a cross-sectional view illustrating an example of a configuration of a multipoint tactile display as an application example.

FIG. 28 is a cross-sectional view illustrating an example of a configuration of a multipoint tactile display 500 as an application example. The multipoint tactile display 500 is similar to the actuator 10 according to the first embodiment or one of the modifications of the first embodiment, or the actuator 110 according to the second embodiment or the modification of the second embodiment, except that the multipoint tactile display 500 has a cylindrical shape. The multipoint tactile display 500 is an example of a drive apparatus.

The multipoint tactile display 500 includes a plurality of constraining members 14 on its inner peripheral surface S1, and includes a plurality of constraining members 15 on its outer peripheral surface S2. In the multipoint tactile display 500, the inner peripheral surface S1 is attached to a body part 501 through the plurality of constraining members 14. Example of the body part 501 to which the multipoint tactile display 500 is attached include an arm, a leg, and a finger, but the body part 501 is not limited thereto.

Experimental Examples

The present disclosure is specifically described below using experimental examples, but the present disclosure is not limited to these experimental examples.

Figure 29A:
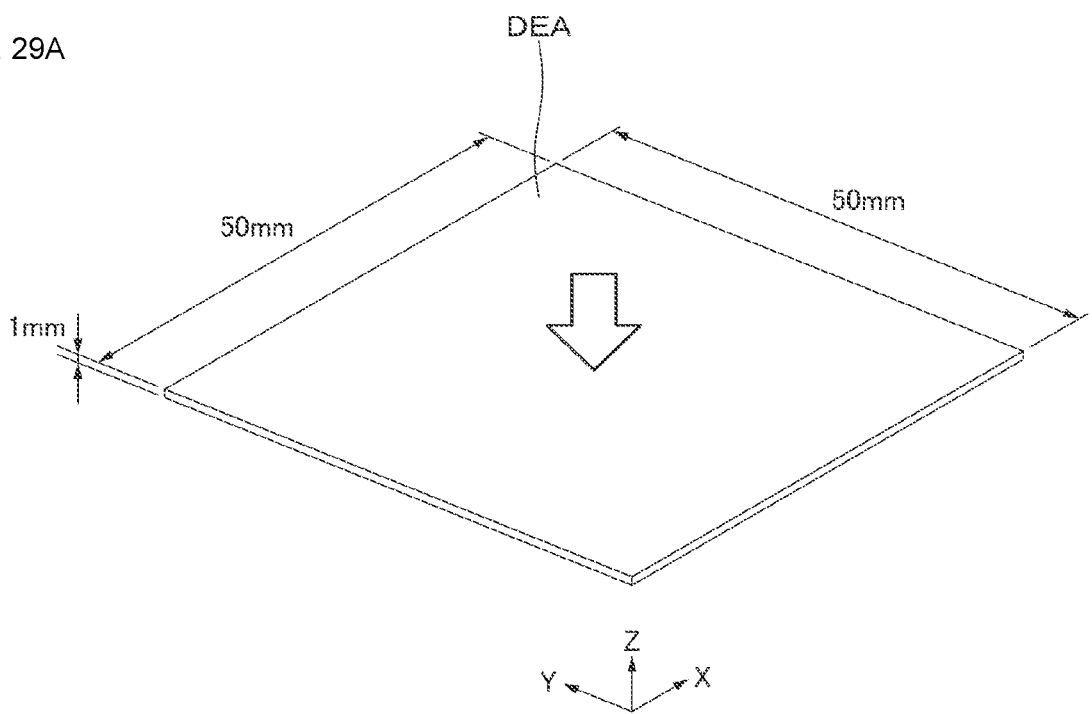
FIG. 29A schematically illustrates a model of a simulation of a first experimental example.
Figure 29B:
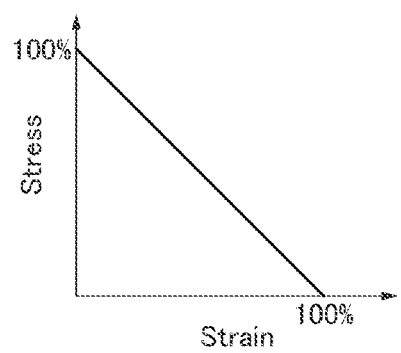
FIG. 29B is a graph of a result of the simulation of the first experimental example.

[First Experimental Example] A of FIG. 29A schematically illustrates a model of a Finite Element Method (FEM) simulation of a first experimental example. In the first experimental example, the actuator body 10A in the form of a square film (DEA: a Young's modulus of 0.8 MPa, a Poisson's ratio of 0.5) was used as a model of the FEM simulation. The S-S characteristics when the actuator was driven were analyzed using the FEM simulation. FIG. 29B illustrates a result of it.

Figure 30A:
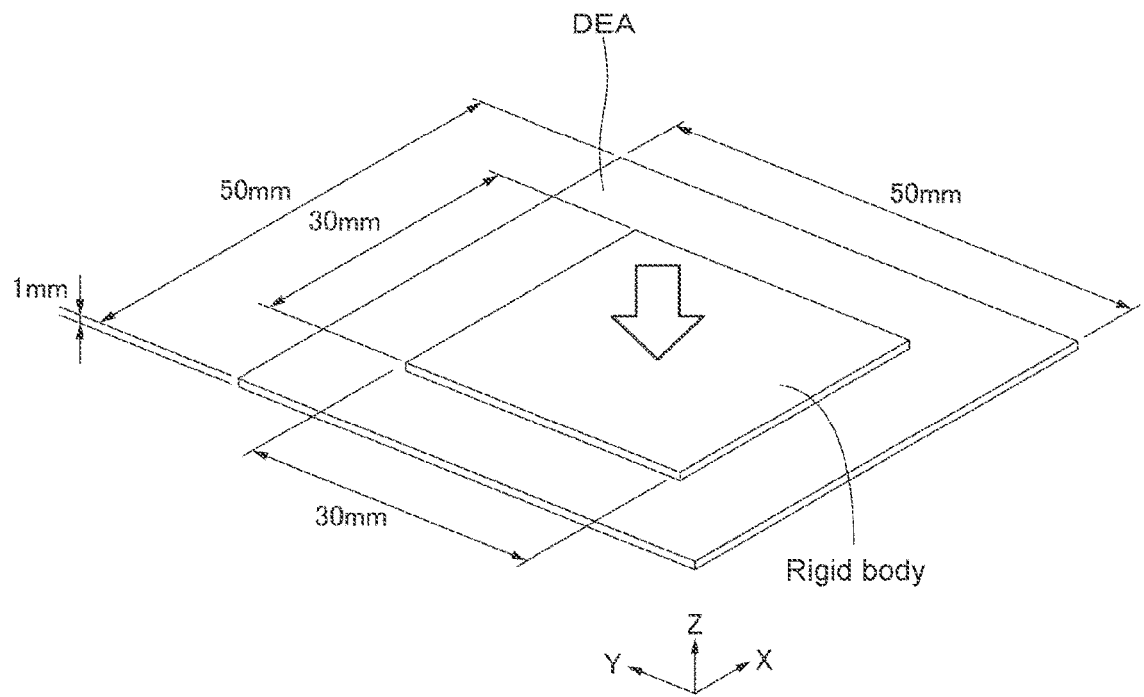
FIG. 30A schematically illustrates a model of a simulation of a second experimental example.
Figure 30B:
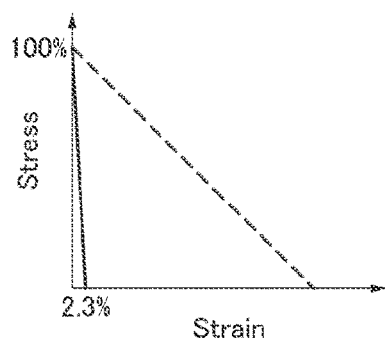
FIG. 30B is a graph of a result of the simulation of the second experimental example.

[Second Experimental Example] FIG. 30A schematically illustrates a model of an FEM simulation of a second experimental example. In the second experimental example, a square rigid body in the form of a thin plate was formed on a primary surface of the actuator of the first experimental example, and the obtained actuator was used as a model of the FEM simulation. The S-S characteristics when the actuator was driven were analyzed using the FEM simulation. FIG. 30B illustrates a result of it.

Figure 31A:
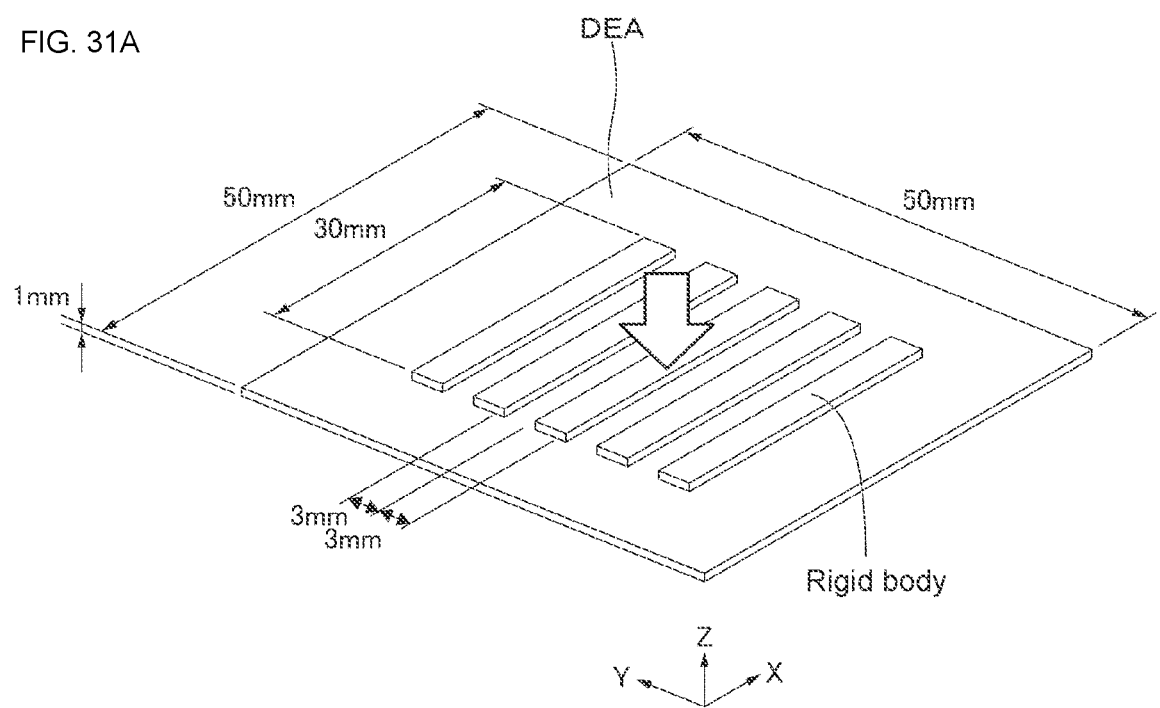
FIG. 31A schematically illustrates a model of a simulation of a third experimental example.
Figure 31B:
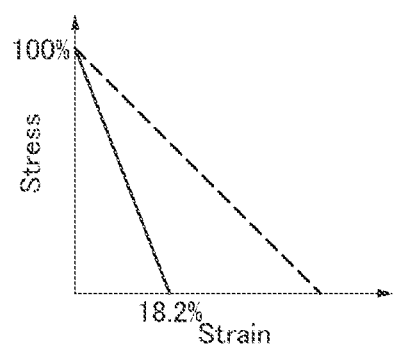
FIG. 31B is a graph of a result of the simulation of the third experimental example.

[Third Experimental Example] FIG. 31A schematically illustrates a model of an FEM simulation of a third experimental example. In the third experimental example, a stripe rigid body was formed on the primary surface of the actuator of the first experimental example, and the obtained actuator was used as a model of the FEM simulation. The S-S characteristics when the actuator was driven were analyzed using the FEM simulation. FIG. 31B illustrates a result of it.

The results of the FEM simulations described above show that the actuator including the stripe rigid body on its primary surface exhibits an amount of displacement about ten times greater than the amount of displacement exhibited by the actuator including, on its primary surface, the square rigid body in the film of a thin plate.

Figure 32A:
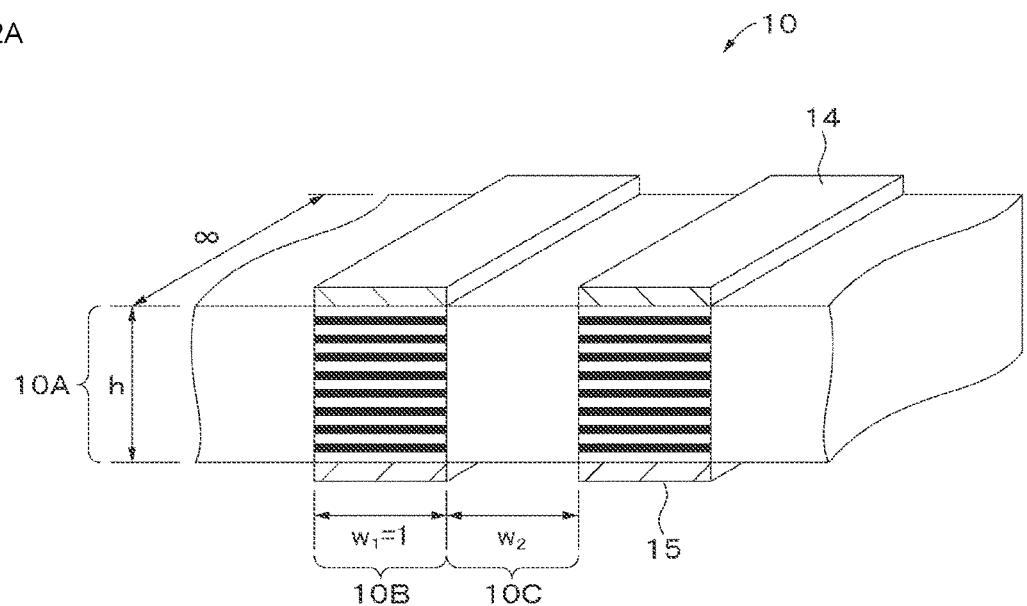
FIG. 32A schematically illustrates a model of simulations of fourth to twelfth experimental examples.
Figure 32B:
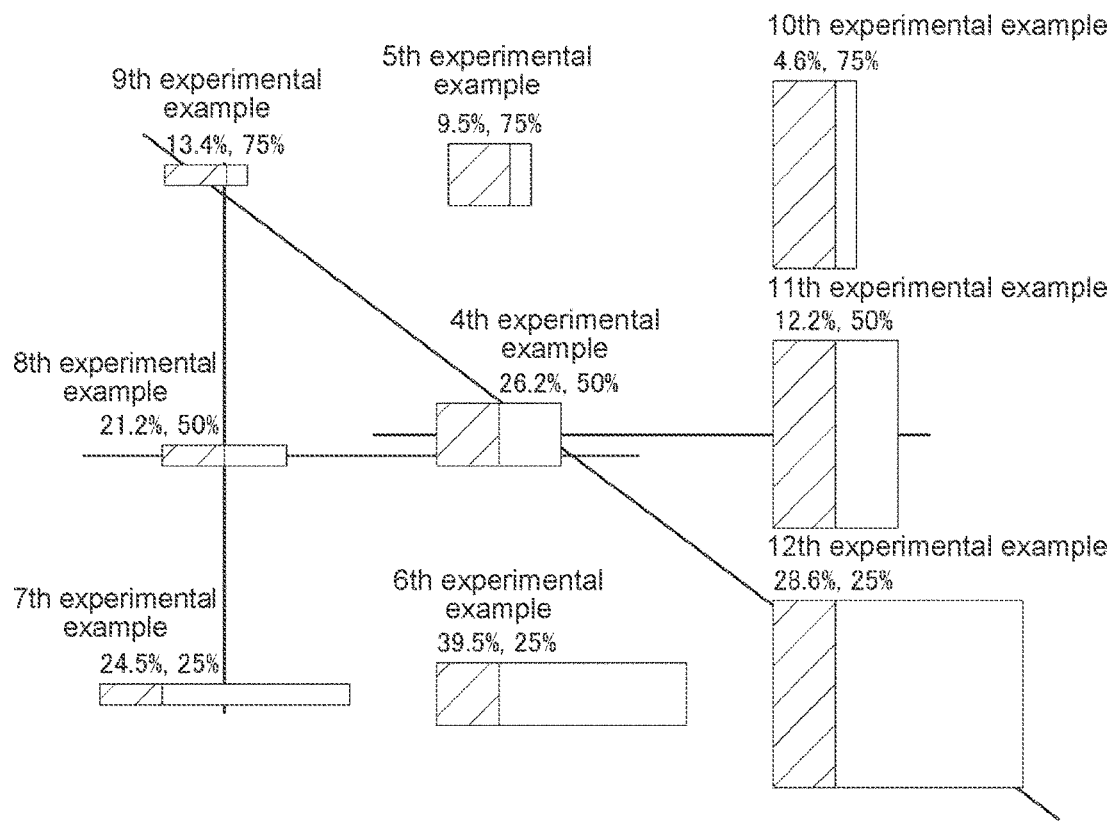
FIG. 32B is a graph of results of the simulations of the fourth to twelfth experimental examples.

[Fourth to Twelfth Experimental Examples] FIG. 32A schematically illustrates a model of FEM simulations of fourth to twelfth experimental examples. Note that a portion of this model that corresponds to a portion of the first embodiment is denoted by the same reference numeral as the portion of the first embodiment. A strain maintaining rate and a stress maintaining rate of the model were analyzed using the FEM simulations. The strain maintaining rate is a rate of strain caused under each condition, with a certain value being used as a reference, the certain value being obtained by dividing an amount of displacement by the length of a device in a drive direction in which the device is driven, the displacement being caused upon driving performed when $w2=0$ and in a no-load state in which the primary surface of the actuator 10 is unconstrained. The stress maintaining rate is a rate of stress caused under each condition, with a certain value being used as a reference, the certain value being obtained by dividing a generated force by the area of a cross section that is orthogonal to the direction in which the device is driven, the generated force being generated upon driving performed when w2=0 and when the primary surface of the actuator 10 is fully constrained. In the FEM simulations of the fourth to twelfth experimental examples, the width $w_1$ of the constraint portion 10B was fixed to 1, and the width $w_2$ of the unconstraint portion 10C and the thickness h of the actuator 10A were changed, as shown in Table 1. Results of them are shown in Table 1 and FIG. 32B.

Conditions for and the results of the FEM simulations of the fourth to twelfth experimental examples are given in Table 1.

TABLE 1

|  | h | $w_1$ | $w_2$ | Strain maintaining rate [%] | Stress maintaining rate [%] |
| --- | --- | --- | --- | --- | --- |
| 4th experimental example | 1 | 1 | 1 | 26.2 | 50 |
| 5th experimental example | 1 | 1 | 1/3 | 9.5 | 75 |
| 6th experimental example | 1 | 1 | 3 | 39.5 | 25 |
| 7th experimental example | 1/3 | 1 | 3 | 24.5 | 25 |
| 8th experimental example | 1/3 | 1 | 1 | 21.2 | 50 |
| 9th experimental example | 1/3 | 1 | 1/3 | 13.4 | 75 |
| 10th experimental example | 3 | 1 | 1/3 | 4.6 | 75 |
| 11th experimental example | 3 | 1 | 1 | 12.2 | 50 |
| 12th experimental example | 3 | 1 | 3 | 28.6 | 25 |

The results of the FEM simulations described above show that, under the condition that the width $w_1$ of the constraint portion 10B is 1, a satisfactory strain maintaining rate and a satisfactory stress maintaining rate are obtained when the width $w_2$ of the unconstraint portion 10C is not less than 1 or is not greater than ⅓, and the thickness h of the actuator body 10A is not less than 1 or is ⅓.

Further, the results show that, under the condition that the width $w_1$ of the constraint portion 10B is 1, a favorable balance between stress and strain is achieved when the width $w_2$ of the unconstraint portion 10C is about 1, and the thickness h of the actuator body 10A is about 1.

Thirteenth Experimental Example

Figure 33:
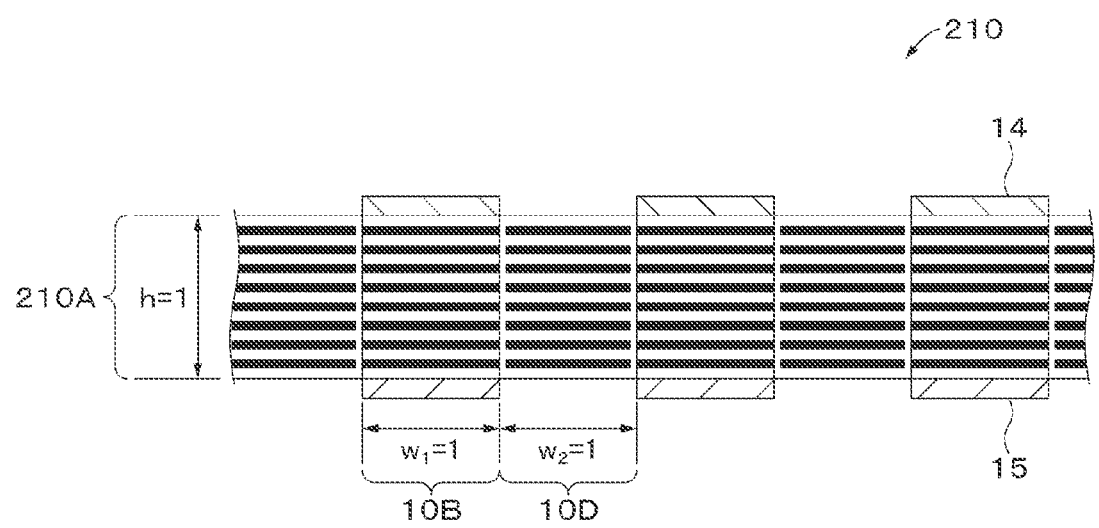
FIG. 33 schematically illustrates a model of simulations of thirteenth and fourteen experimental examples.

FIG. 33 schematically illustrates a model of an FEM simulation of a thirteenth experimental example. Note that a portion of this model that corresponds to a portion of the second embodiment is denoted by the same reference numeral as the portion of the second embodiment. The width W of the constraint portion 10B was set such that $w_1$=1, the width $w_2$ of the unconstraint portion 10D was set to 1, and the thickness h of the actuator body 210A was set to 1. In this model, a state and a strain maintaining rate of the constraint portion 10B when voltage was applied to the constraint portion 10B and the constraint portion 10B was driven were analyzed using the FEM simulation. As a result, the constraint portion 10B contracted in a direction of the thickness of the actuator body 210A, and the strain maintaining rate of the constraint portion 10B was 26.2%. Note that the strain maintaining rate refers to a strain maintaining rate similar to the strain maintaining rate in the fourth to twelfth experimental examples described above.

Fourteenth Experimental Example

In a model similar to the model of the thirteenth experimental example, the state and the strain maintaining rate of the constraint portion 10B when voltage was applied to the unconstraint portion 10C and the unconstraint portion 10C was driven were analyzed using the FEM simulation. As a result, the constraint portion 10B expanded in the direction of the thickness of the actuator body 210A, and the strain maintaining rate of the constraint portion 10B was 23.3%. Note that the strain maintaining rate refers to a strain maintaining rate similar to the strain maintaining rate in the fourth to twelfth experimental examples described above.

The embodiments and the modifications of the present disclosure have been specifically described above. However, the present disclosure is not limited to the embodiments and the modifications described above, and various modifications based on the technical idea of the present disclosure may be made thereto. For example, the configurations, the methods, the processes, the shapes, the materials, the numerical values, and the like in the embodiments and the modifications described above are merely illustrative, and a configuration, a method, a process, a shape, a material, a numerical value, and the like that are different from those described above may be used as necessary. The configurations, the methods, the processes, the shapes, the materials, the numerical values, and the like in the embodiments and the modifications described above may be combined without departing from the spirit of the present disclosure. One of the materials in the embodiments and the modifications described above may be used alone, or two or more thereof may be used in combination, unless otherwise specified.

Further, the present disclosure may also take the following configurations.

(1) An actuator, including:
an actuator body that includes a first surface and a second surface that face each other;
a first constraining member that is provided on the first surface, and constrains the first surface from expanding and contracting; and
a second constraining member that is provided on the second surface, and constrains the second surface from expanding and contracting,
the actuator body including
a first electrode,
a second electrode that faces the first electrode, and
an elastomer layer that is provided between the first electrode and the second electrode,
the first electrode being a pattern electrode,
the first constraining member and the second constraining member being provided correspondingly to the first electrode.

(2) The actuator according to (1), in which
the first electrode and the second electrode each have a Young's modulus not greater than ten times the Young's modulus of the elastomer layer.

(3) The actuator according to (1) or (2), in which
the first constraining member and the second constraining member each have a Young's modulus not less than three times the Young's modulus of the actuator body.

(4) The actuator according to any one of (1) to (3), in which
when a width $w_1$ of a drive portion of the actuator body satisfies $w_{1=1}$, a width $w_2$ of a non-drive portion of the actuator body satisfies $0.1 \le w_2 \le 10$, and a thickness h of the actuator body satisfies $0.1 \le h \le 10$.

(5) The actuator according to any one of (1) to (4), in which
the actuator body includes
a constraint portion that is situated between the first constraining member and the second constraining member, and an unconstraint portion that is provided between the constraint portions being adjacent to each other, and the elastomer layer in the constraint portion is thinner than the elastomer layer in the unconstraint portion.

(6) The actuator according to any one of (1) to (5), in which the second electrode is a pattern electrode.

(7) The actuator according to any one of (1) to (5), in which the second electrode is a non-pattern electrode.

(8) The actuator according to any one of (1) to (7), in which there is a gap between the first electrodes in an in-plane direction of the actuator body, and the actuator body further includes a dummy electrode that is provided in the gap.

(9) The actuator according to any one of (1) to (8), in which there is a gap between the first electrodes in an in-plane direction of the actuator body, the actuator body further includes a third electrode that is provided in the gap, and the first electrode and the third electrode are situated across the elastomer layer from the second electrode.

(10) The actuator according to any one of (1) to (9), further including sandwiching members between which the actuator body is sandwiched from a side of the first surface through the first constraining member and from a side of the second surface through the second constraining member, in which the sandwiching members respectively press the first constraining member and the second constraining member.

(11) The actuator according to any one of (1) to (10), in which the elastomer layer is in the form of a loop.

(12) The actuator according to any one of (1) to (11), in which the first constraining member and the second constraining member each have a pattern similar to a pattern of the first electrode.

(13) A drive apparatus, including:

an actuator that includes a first surface and a second surface that face each other;

a driven body that is provided on the first surface; and a base material that is provided on the second surface, the actuator including a first electrode, a second electrode that faces the first electrode, and an elastomer layer that is provided between the first electrode and the second electrode, the driven body including a first constraining member that constrains the first surface, the base material including a second constraining member that constrains the second surface, the first electrode being a pattern electrode, the first constraining member and the second constraining member being provided correspondingly to the first electrode.

(14) The drive apparatus according to (13), in which the first constraining member is a protruding first convex portion that is provided on the first surface, and the second constraining member is a protruding second convex portion that is provided on the second surface.

(15) An actuator, including:

an actuator body that includes a first surface and a second surface that face each other;

a first constraining member that is provided on the first surface, and constrains the first surface from expanding and contracting; and a second constraining member that is provided on the second surface, and constrains the second surface from expanding and contracting, the actuator body including a first electrode, a second electrode that faces the first electrode, and an elastomer layer that is provided between the first electrode and the second electrode, the first electrode including at least one of a gap or a hole, the first constraining member and the second constraining member being provided correspondingly to the first electrode.

(16) A drive apparatus including the actuator according to any one of (1) to (12) and (15).

(17) An electronic apparatus including the actuator according to any one of (1) to (12) and (15).

REFERENCE SIGNS LIST

10, 110, 210 actuator
10A, 210A actuator body
10B constraint portion
10C, 10D unconstraint portion
11, 11A elastomer layer
12 electrode (first electrode)
13 electrode (second electrode)
14 constraint portion (first constraint portion)
15 constraint portion (second constraint portion)
14A, 15A gap
16, 17 extraction electrode
18 non-pattern electrode (second electrode)
19 dummy electrode
21 driven body
22 base material
31, 32 leaf spring
33, 34 holding member
35, 36 magnet
37 base material
212 electrode (third electrode)
214 electrode (second electrode)
300 image-capturing apparatus (electronic apparatus)
400 display apparatus (electronic apparatus, drive apparatus)
500 multipoint tactile display (drive apparatus)
S1 first surface
S2 second surface

The invention claimed is:

1. An actuator, comprising:
an actuator body that includes:
a first surface; and
a second surface that faces the first surface;
a first constraining member on the first surface, wherein the first constraining member is configured to constrain the first surface from expansion and contraction; and
a second constraining member on the second surface, wherein
the second constraining member is configured to constrain the second surface from expansion and contraction,
the actuator body further includes:
a plurality of first electrodes;
a plurality of second electrodes, wherein the plurality of second electrodes faces the plurality of first electrodes;
an elastomer layer between the plurality of first electrodes and the plurality of second electrodes;
a plurality of constraint portions including a first constraint portion and a second constraint portion, wherein the first constraint portion of the plurality of constraint portions is between the first constraining member and the second constraining member; and an unconstraint portion between the first constraint portion and the second constraint portion, wherein the unconstraint portion is adjacent to each of the first constraint portion and the second constraint portion, a first part of the elastomer layer in the first constraint portion is thinner than a second part of the elastomer layer in the unconstraint portion, and each of the first constraining member and the second constraining member corresponds to a respective first electrode of the plurality of first electrodes.

2. The actuator according to claim 1, wherein
each first electrode of the plurality of first electrodes has a first value of Young's modulus and each second electrode of the plurality of first electrodes has a second value of the Young's modulus, and
each of the first value of the Young's modulus and the second value of the Young's modulus is one of equal to or less than ten times a third value of the Young's modulus of the elastomer layer.

3. The actuator according to claim 1, wherein
the first constraining member has a first value of Young's modulus and the second constraining member has a second value of the Young's modulus, and
each of the first value of the Young's modulus and the second value of the Young's modulus is one of equal to or greater than three times a third value of the Young's modulus of the actuator body.

4. The actuator according to claim 1, wherein
in a case where a width $w_1$ of a drive portion of the actuator body satisfies $w_1=1$, a range of a width $w_2$ of a non-drive portion of the actuator body is $0.1 \leq w_2 \leq 10$, and a range of thickness h of the actuator body is $0.1 \leq h \leq 10$.

5. The actuator according to claim 1, further comprising a gap between at least two second electrodes of the plurality of second electrodes.

6. The actuator according to claim 1,
wherein the plurality of second electrodes is in a continuous manner.

7. The actuator according to claim 1, further comprising a gap between at least two first electrodes of the plurality of the first electrodes in an in-plane direction of the actuator body, wherein the actuator body further includes a dummy electrode in the gap.

8. The actuator according to claim 1, further comprising a gap between at least two first electrodes of the plurality of the first electrodes in an in-plane direction of the actuator body, wherein
the actuator body further includes a third electrode in the gap, and
each first electrode of the plurality of first electrodes and the third electrode extend across the elastomer layer from a respective second electrode of the plurality of second electrodes.

9. The actuator according to claim 1, further comprising:
a set of sandwiching members, wherein
a first sandwiching member of the set of sandwiching members is configured to press a side of the first surface of the actuator through the first constraining member; and a second sandwiching member of the set of sandwiching members configured to press a side of the second surface of the actuator through the second constraining member.

10. The actuator according to claim 1, wherein the elastomer layer comprises a loop.

11. The actuator according to claim 1, wherein
each of the first constraining member and the second constraining member has a pattern similar to a pattern of the plurality of first electrodes, and
the pattern of the plurality of first electrodes includes a stripe pattern.

12. A drive apparatus comprising the actuator according to claim 1.

13. An electronic apparatus comprising the actuator according to claim 1.

14. A drive apparatus, comprising:
an actuator that includes:
an actuator body including:
a first surface;
a second surface that faces the first surface;
a driven body on the first surface, wherein the driven body includes a first constraining member; and
a base material on the second surface, wherein
the base material includes a second constraining member,
the actuator body further includes:
a plurality of first electrodes;
a plurality of second electrodes, wherein the plurality of second electrodes faces the plurality of first electrodes;
an elastomer layer between the plurality of first electrodes and the plurality of second electrodes;
a plurality of constraint portions including a first constraint portion and a second constraint portion, wherein the first constraint portion of the plurality of constraint portions is between the first constraining member and the second constraining member; and
an unconstraint portion between the first constraint portion and the second constraint portion, wherein the unconstraint portion is adjacent to each of the first constraint portion and the second constraint portion,
a first part of the elastomer layer in the first constraint portion is thinner than a second part of the elastomer layer in the unconstraint portion,
the first constraining member is configured to constrain that constrains the first surface,
the second constraining member is configured to constrain the second surface,
the plurality of first electrodes has a pattern, wherein the pattern includes a stripe pattern, and
each of the first constraining member and the second constraining member corresponds to a respective first electrode of the plurality of first electrodes.

15. The drive apparatus according to claim 14, wherein
the first constraining member includes a protruding first convex portion on the first surface of the actuator, and
the second constraining member includes a protruding second convex portion on the second surface of the actuator.

16. An actuator, comprising:
an actuator body including:
a first surface; and
a second surface that faces the first surface;

a first constraining member on the first surface, wherein the first constraining member is configured to constrain the first surface from expansion and contraction; and a second constraining member on the second surface, wherein the second constraining member is configured to constrain the second surface from expansion and contraction;

the actuator body further includes:

a plurality of first electrodes;

a plurality of second electrodes, wherein the plurality of second electrodes faces the plurality of first electrodes;

an elastomer layer between the plurality of first electrodes and the plurality of second electrodes;

a plurality of constraint portions including a first constraint portion and a second constraint portion, wherein the first constraint portion of the plurality of constraint portions is between the first constraining member and the second constraining member; and an unconstraint portion between the first constraint portion and the second constraint portion, wherein the unconstraint portion is adjacent to each of the first constraint portion and the second constraint portion, a first part of the elastomer layer in the first constraint portion is thinner than a second part of the elastomer layer in the unconstraint portion, the plurality of first electrodes has a pattern, the pattern includes at least one of a gap or a hole, and each of the first constraining member and the second constraining member corresponds to a respective first electrode of the plurality of first electrodes.

\* \* \* \* \*